(12) United States Patent
Sato et al.

(10) Patent No.: US 11,815,348 B2
(45) Date of Patent: Nov. 14, 2023

(54) TEMPLATE, WORKPIECE, AND ALIGNMENT METHOD

(71) Applicant: Kioxia Corporation, Tokyo (JP)

(72) Inventors: Takashi Sato, Kanagawa (JP); Satoshi Mitsugi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 139 days.

(21) Appl. No.: 17/471,026

(22) Filed: Sep. 9, 2021

(65) Prior Publication Data

US 2022/0307826 A1 Sep. 29, 2022

(30) Foreign Application Priority Data

Mar. 23, 2021 (JP) ................... 2021-048653

(51) Int. Cl.
| | | |
|---|---|---|
| *G01B 11/27* | (2006.01) | |
| *G03F 1/42* | (2012.01) | |
| *H01L 23/544* | (2006.01) | |

(52) U.S. Cl.
CPC .............. *G01B 11/272* (2013.01); *G03F 1/42* (2013.01); *H01L 23/544* (2013.01); *H01L 2223/54426* (2013.01)

(58) Field of Classification Search
CPC ...................... G03F 1/42; H01L 23/544; H01L 2223/54426
USPC ........................................................ 356/364
See application file for complete search history.

(56) References Cited

U.S. PATENT DOCUMENTS

| | | | | |
|---|---|---|---|---|
| 5,847,468 | A * | 12/1998 | Nomura ............... | G03F 9/7076 257/E23.179 |
| 9,620,458 | B2 | 4/2017 | Cai et al. | |
| 2004/0080808 | A1 | 4/2004 | Kawakami et al. | |
| 2007/0052113 | A1* | 3/2007 | Marokkey ............ | G03F 9/7076 257/E23.179 |
| 2016/0093574 | A1 | 3/2016 | Cai et al. | |
| 2017/0170129 | A1 | 6/2017 | Cai et al. | |
| 2019/0293998 | A1* | 9/2019 | Hasegawa ............. | G02F 1/1333 |

FOREIGN PATENT DOCUMENTS

| | | |
|---|---|---|
| CN | 105511238 A | 4/2016 |
| CN | 108351595 A | 7/2018 |
| JP | H6-118624 A | 4/1994 |
| JP | 4294264 B2 | 7/2009 |
| JP | 2018-22807 A | 2/2018 |
| JP | 2019-9384 A | 1/2019 |
| WO | WO 2009/12559 A1 | 10/2009 |
| WO | WO 2009-125529 A1 | 10/2009 |

\* cited by examiner

*Primary Examiner* — Michael A Lyons
*Assistant Examiner* — Omar H Nixon
(74) *Attorney, Agent, or Firm* — Finnegan, Henderson, Farabow, Garrett & Dunner, LLP

(57) ABSTRACT

According to one embodiment, a template includes an alignment mark. The alignment mark includes first marks arranged at a first pitch in a first direction and second marks arranged at a second pitch in the first direction. At least one of the first marks includes a first region and a third region. At least one of the second marks includes a second region and the third region. The first region has first patterns arranged in a line-and-space form in the first direction. The second region has second patterns arranged in a line-and-space form in a second direction orthogonal to the first direction.

18 Claims, 17 Drawing Sheets

TEMPLATE, WORKPIECE, AND ALIGNMENT METHOD

CROSS-REFERENCE TO RELATED APPLICATIONS

This application is based upon and claims the benefit of priority from Japanese Patent Application No. 2021-048653, filed on Mar. 23, 2021; the entire contents of which are incorporated herein by reference.

FIELD

Embodiments described herein relate generally to a template, a workpiece, and an alignment method.

BACKGROUND

In a process for manufacturing a semiconductor device, an imprinting method has been employed to form fine patterns on a workpiece. In the imprinting method, alignment processing is performed to align a workpiece with the template on which the patterns are formed. In the alignment processing, alignment marks provided on each of the template and the workpiece are used. As semiconductor devices have been small-sized and patterns have been fine, it is required to reduce an area occupied by alignment marks.

DETAILED DESCRIPTION

Figure 1:
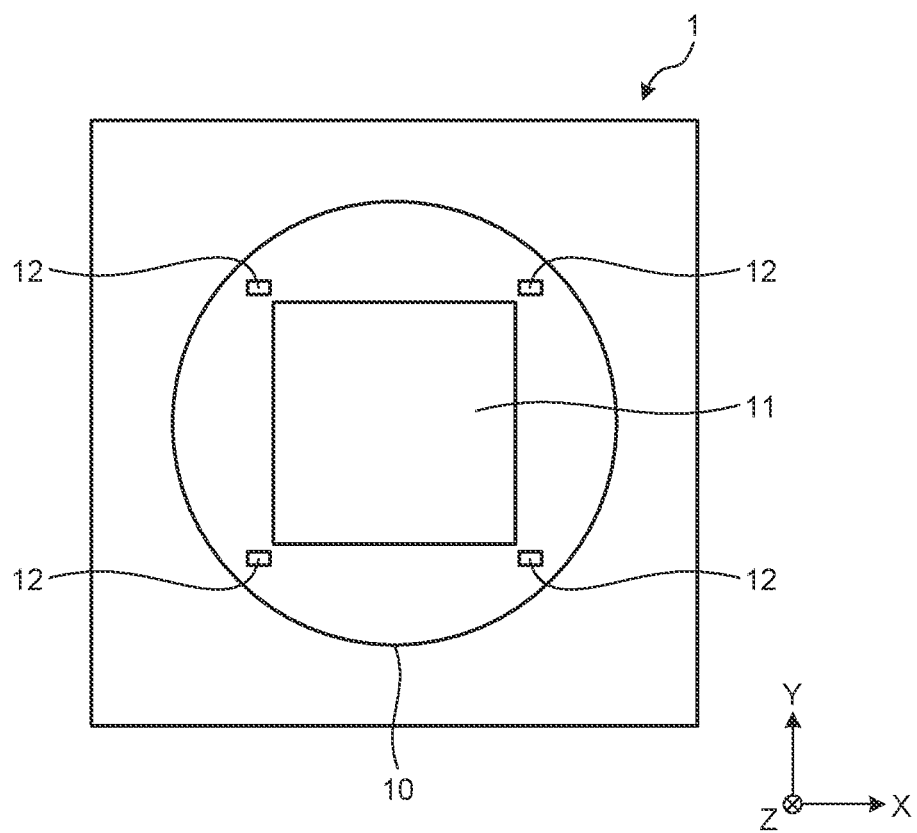
FIG. 1 is a bottom view illustrating an example of a configuration of a template according to a first embodiment.

In general, according to one embodiment, a template includes an alignment mark. The alignment mark includes first marks arranged at a first pitch in a first direction and second marks arranged at a second pitch in the first direction. At least one of the first marks includes a first region and a third region. At least one of the second marks includes a second region and the third region. The first region has first patterns arranged in a line-and-space form in the first direction. The second region has second patterns arranged in a line-and-space form in a second direction orthogonal to the first direction.

Hereinafter, embodiments of the present invention will be described with reference to the drawings. Note that the present invention is not limited to the embodiments. In addition, constituent elements in the embodiments include those that can be easily assumed by those skilled in the art or those that are substantially identical thereto.

First Embodiment

Hereinafter, a technique related to alignment between a template and a workpiece (e.g., a wafer) in an imprinting method for forming predetermined patterns on the workpiece using the template will be described.

<Configuration of Template>

A configuration of the template 1 used in the imprinting method will be described with reference to FIGS. 1 to 8. In the drawings, an X axis corresponds to a left-right direction on a horizontal plane, a Y axis corresponds to a front-rear direction on the horizontal plane, and a Z axis corresponds to a vertical (up-down) direction with respect to the horizontal plane.

FIG. 1 is a bottom view illustrating an example of a configuration of a template 1 according to a first embodiment. The template 1 is a plate-like member made of a transparent material transmitting visible light and ultraviolet rays, for example, a material containing quartz as a main component. The template 1 exemplified here has a rectangular shape, for example, a square shape with a side length of about 150 mm.

A table-shaped mesa portion 10 protruding downward is formed at a center portion of a bottom surface of the template 1. In the mesa portion 10, a device pattern region 11 and alignment regions 12 are formed. Note that, although it is exemplified in FIG. 1 that the mesa portion 10 has a circular shape in the bottom view (plan view), the mesa portion 10 may have a rectangular shape in the bottom view. In the device pattern region 11, patterns (concave portions or convex portions) to be imprinted on the workpiece are formed.

In the alignment regions 12, alignment marks used for alignment processing to align the workpiece with the template 1 are formed. Note that the alignment regions 12 may be formed in the device pattern region 11.

Figure 2:
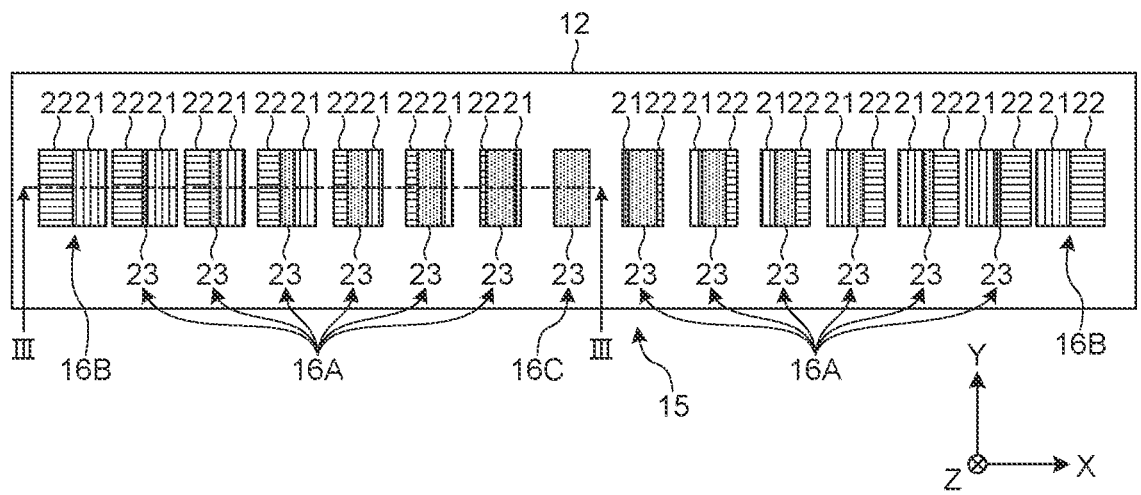
FIG. 2 is a bottom view illustrating an example of a configuration of alignment marks of the template according to the first embodiment.
Figure 3:
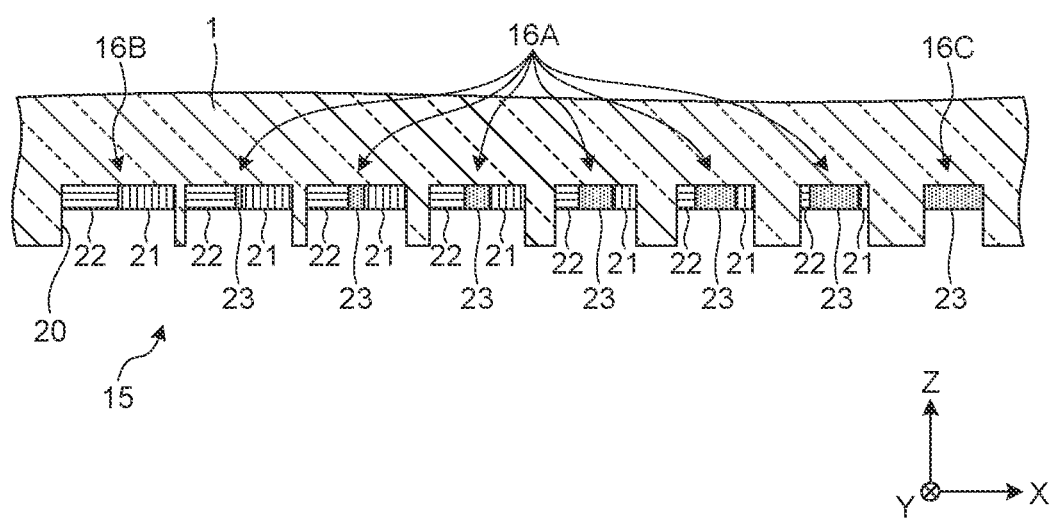
FIG. 3 is a cross-sectional view illustrating the example of the configuration of the alignment marks of the template according to the first embodiment, when taken along line III-III.

FIG. 2 is a bottom view illustrating an example of a configuration of the alignment marks 15 of the template 1 according to the first embodiment. FIG. 3 is a cross-sectional view illustrating the example of the configuration of the alignment marks 15 of the template 1 according to the first embodiment, when taken along line III-III.

The alignment marks 15 (first alignment marks) include a plurality of reflectors 16A, 16B, and 16C. The plurality of reflectors 16A, 16B, 16C are arranged in an X-axis direction (first direction). The plurality of reflectors 16A, 16B, and 16C are formed on respective lower surfaces of a plurality of recesses 20 formed in the alignment region 12.

The reflector 16A includes a first region 21, a second region 22, and a third region 23. The first region 21 is a region where reflective films reflecting light (e.g., visible light) are arranged in a line-and-space (hereinafter abbreviated as L/S) form in a Y-axis direction (second direction).

The second region 22 is a region where reflective films are arranged in an L/S form in the X-axis direction. The third region 23 is a region in which reflective films are arranged in a solid or lattice form. The first region 21 is a region where X-polarized light (first polarized light) having electric fields vibrating along an X-Z plane (first plane) is transmitted with a higher transmittance than Y-polarized light (second polarized light) having electric fields vibrating along a Y-Z plane (second plane orthogonal to the first plane), and the Y-polarized light is reflected with a higher reflectance than the X-polarized light. The second region 22 is a region where the where the Y-polarized light is transmitted with a higher transmittance than the X-polarized light, and the X-polarized light is reflected with a higher reflectance than the Y-polarized light. The third region 23 is a region in which the X-polarized light and the Y-polarized light are reflected. The X-polarized light may be, for example, transverse magnetic (TM) polarized light. The Y-polarized light may be, for example, transverse electric (TE) polarized light.

In addition to the reflector 16A, the reflector 16B and the reflector 16C are included in the alignment marks 15, the reflector 16B including a first region 21 and a second region 22, and the reflector 16C including a third region 23. Hereinafter, the reflectors 16A, 16B, and 16C may be referred to as reflectors 16 when they do not need to be distinguished from each other.

Note that, although FIG. 2 exemplifies the configuration of the alignment marks 15 when the template 1 is viewed from below, since the template 1 is formed of a transparent material, the configuration of the alignment marks 15 when the template 1 is viewed from above is the same as that in FIG. 2. In addition, the same also applies to FIGS. 4 to 8 to be described below.

Figure 4:
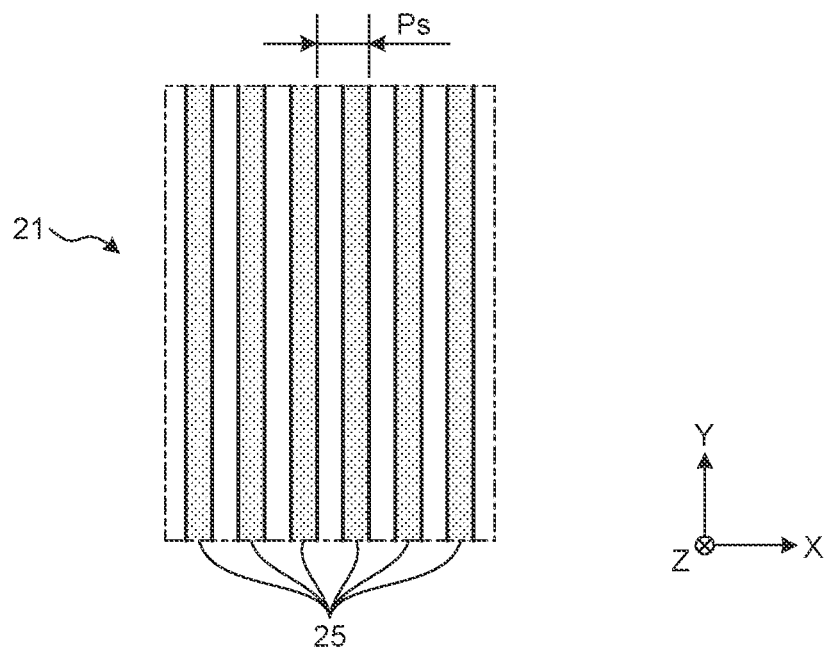
FIG. 4 is a partially enlarged bottom view illustrating an example of a configuration of a first region according to the first embodiment.

FIG. 4 is a partially enlarged bottom view illustrating an example of a configuration of the first region 21 according to the first embodiment. In the first region 21, reflective films 25 arranged in an L/S form are formed along the Y axis (second direction). An L/S pitch Ps between the reflective films 25 is preferably about 100 nm or less. For example, when the pitch Ps is 100 nm or less, it is preferable, in obtaining the optical properties of the first region 21 (transmitting the X-polarized light and reflecting the Y-polarized light) and the optical properties of the second region 22 (transmitting the Y-polarized light and reflecting the X-polarized light) described above, that inspection light (X-polarized light or Y-polarized light) used in alignment processing has a wavelength of about 300 nm to 800 nm. The reflective film 25 is a film (layer) capable of reflecting visible light (e.g., light having a wavelength of 300 nm to 800 nm), and includes a light reflective material such as chromium as a main component. Such a configuration makes it possible to form the first region 21 in which the X-polarized light is transmitted and the Y-polarized light is reflected.

Figure 5:
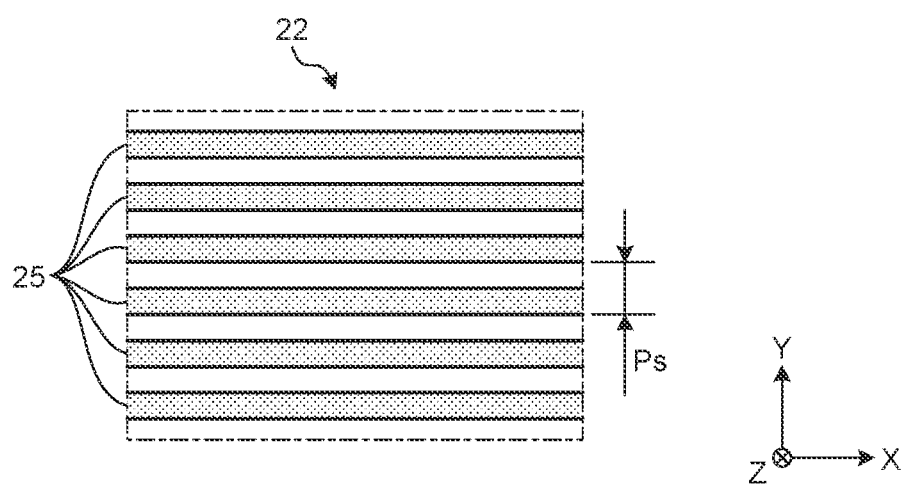
FIG. 5 is a partially enlarged bottom view illustrating an example of a configuration of a second region according to the first embodiment.

FIG. 5 is a partially enlarged bottom view illustrating an example of a configuration of the second region 22 according to the first embodiment. In the second region 22, reflective films 25 arranged in an L/S form are formed along the X axis (first direction). An L/S arrangement pitch Ps between the reflective films 25 is preferably equal to the pitch Ps in the first region 21. Such a configuration makes it possible to form the second region 22 in which the Y-polarized light is transmitted and the X-polarized light is reflected.

Figure 6:
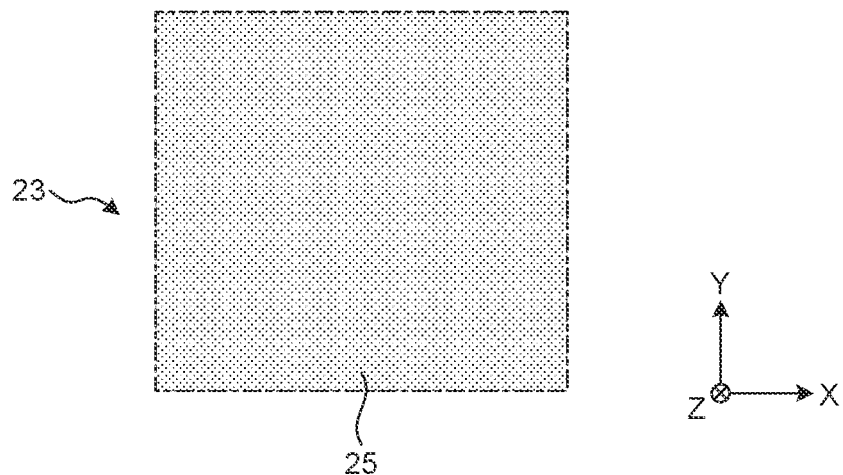
FIG. 6 is a partially enlarged cross-sectional view illustrating a configuration of a third region according to a first example of the first embodiment.

FIG. 6 is a partially enlarged cross-sectional view illustrating a configuration of the third region 23 according to a first example of the first embodiment. In the third region 23 according to the present example, reflective films 25 are formed in a solid form. Such a configuration makes it possible to form the third region 23 in which both the X-polarized light and the Y-polarized light are reflected.

Figure 7:
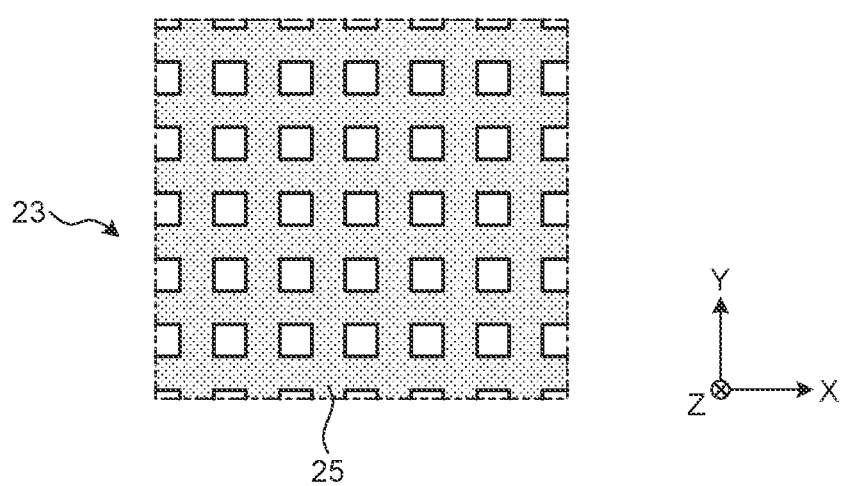
FIG. 7 is a partially enlarged cross-sectional view illustrating a configuration of a third region according to a second example of the first embodiment.

FIG. 7 is a partially enlarged cross-sectional view illustrating a configuration of the third region 23 according to a second example of the first embodiment. In the third region 23 according to the present example, reflective films 25 are formed along the X axis and the Y axis in a lattice form. Such a configuration makes it possible to form the third region 23 in which both the X-polarized light and the Y-polarized light are reflected.

Note that the configuration of the third region 23 is not limited to what has been described above, and may be any configuration as long as the X-polarized light and the Y-polarized light can be reflected at a predetermined reflectance. For example, reflective films 25 may be formed in a lattice form while being inclined at 45 degrees with respect to the X axis and the Y axis in the third region 23.

Figure 8:
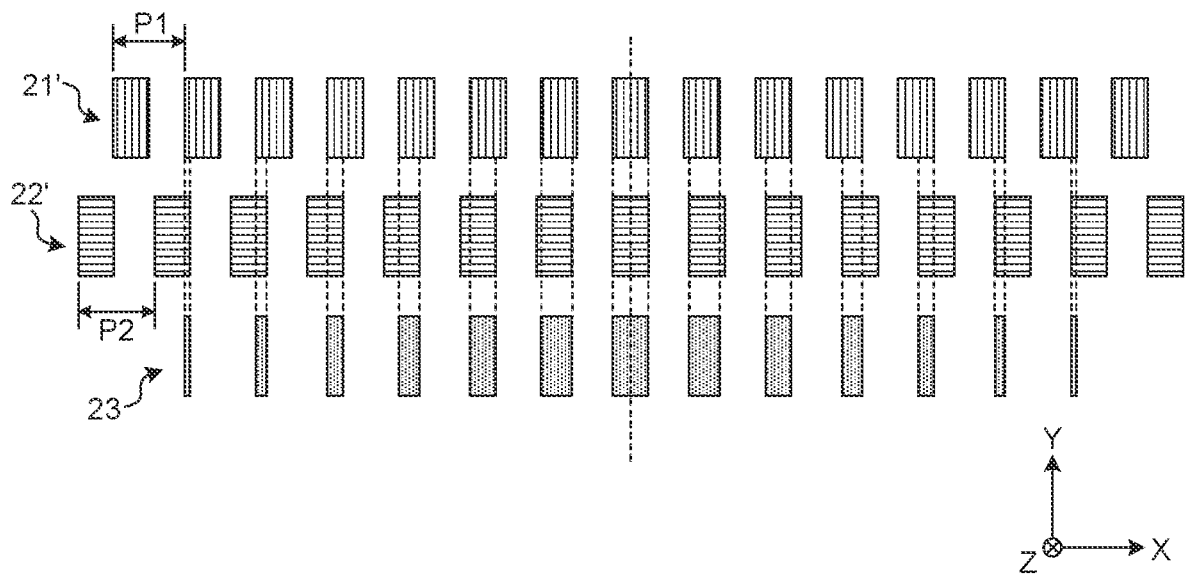
FIG. 8 is a diagram for explaining an example of a relationship between the first region, the second region, and the third region in the alignment marks of the template according to the first embodiment.

FIG. 8 is a diagram for explaining an example of a relationship between the first region 21, the second region 22, and the third region 23 in the alignment marks 15 of the template 1 according to the first embodiment. In FIG. 8, a virtual first region 21' partially corresponding to the first region 21 and a virtual second region 22' partially corresponding to the second region 22 are exemplified. A plurality of virtual first regions 21' are arranged at intervals of a first pitch P1 along the X axis, and a plurality of virtual second regions 22' are arranged at intervals of a second pitch P2 along the X axis, with a relationship established therebetween being P1≠P2 (P1<P2 in the present embodiment). The first pitch P1 and the second pitch P2 are preferably about 2000 nm or less.

As illustrated in FIG. 8, when the plurality of virtual first regions 21' and the plurality of virtual second regions 22' overlap each other with the center in the arrangement direction thereof as a reference, a position at which the third region 23 is formed corresponds to a region where the virtual first region 21' and the virtual second region 22' overlap each other. That is, it can be said that the alignment marks 15 of the embodiment illustrated in FIG. 2 include first marks each including the first region 21 and the third region 23 and second marks each including the second region 22 and the third region 23.

According to the alignment mark 15 having the configuration as described above, the X-polarized light with which the alignment mark 15 is irradiated is reflected in a region including both or one of the first region 21 and the third region 23. Furthermore, the Y-polarized light with which the alignment mark 15 is irradiated is reflected in a region including both or one of the second region 22 and the third region 23.

<Configuration of Workpiece>

Hereinafter, a configuration of a wafer 51 as an example of the workpiece will be described with reference to FIGS. 9 to 12.

Figure 9:
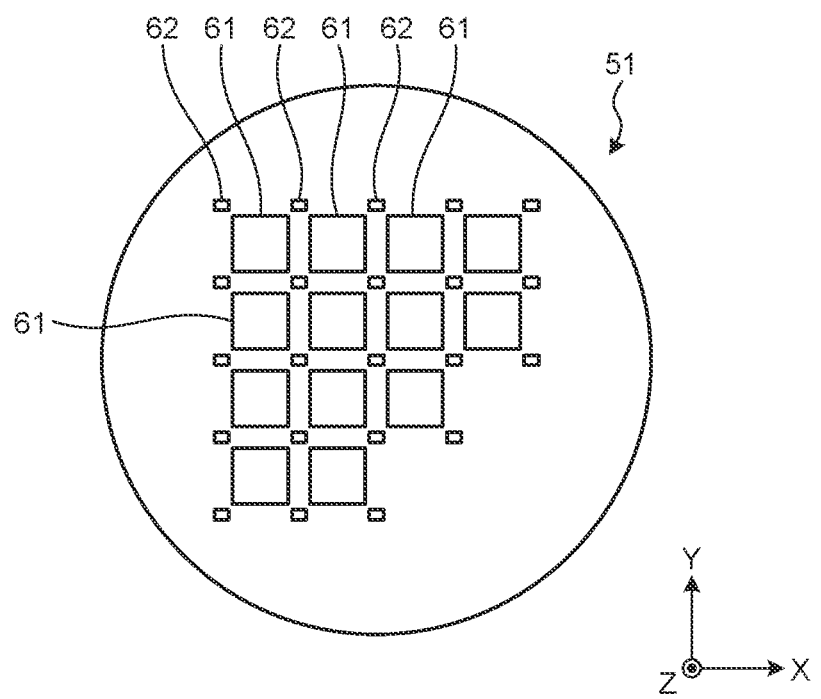
FIG. 9 is a top view illustrating an example of a configuration of a wafer according to the first embodiment.

FIG. 9 is a top view illustrating an example of a configuration of the wafer 51 according to the first embodiment. The wafer 51 is a member processed by imprint processing, and it is not required to particularly limit a specific configuration thereof, but the wafer 51 may include, for example, a substrate made of silicon or the like, a base pattern formed on the substrate, a layer formed on the base pattern to be processed, etc. The layer to be processed may be, for example, an insulating film, a metal film (conductive film), a semiconductor film, or the like.

As illustrated in FIG. 9, a device region 61 and a plurality of alignment regions 62 are formed on an upper surface (surface to be processed) of the wafer 51 according to the present embodiment.

The device region 61 is a region where a predetermined device structure (e.g., three-dimensional NAND) is formed. In the device region 61, after a predetermined layer (protective layer, resist, or the like) is formed, imprinting is performed according to the template 1. After the predetermined device structure is formed in each of a plurality of device regions 61, the respective device regions 61 are diced to be singulated, thereby manufacturing a semiconductor device.

In the alignment regions 62, alignment marks used for alignment processing to align the wafer 51 with the template 1 are formed. Note that the alignment regions 62 may be formed in the device region 61.

Figure 10:
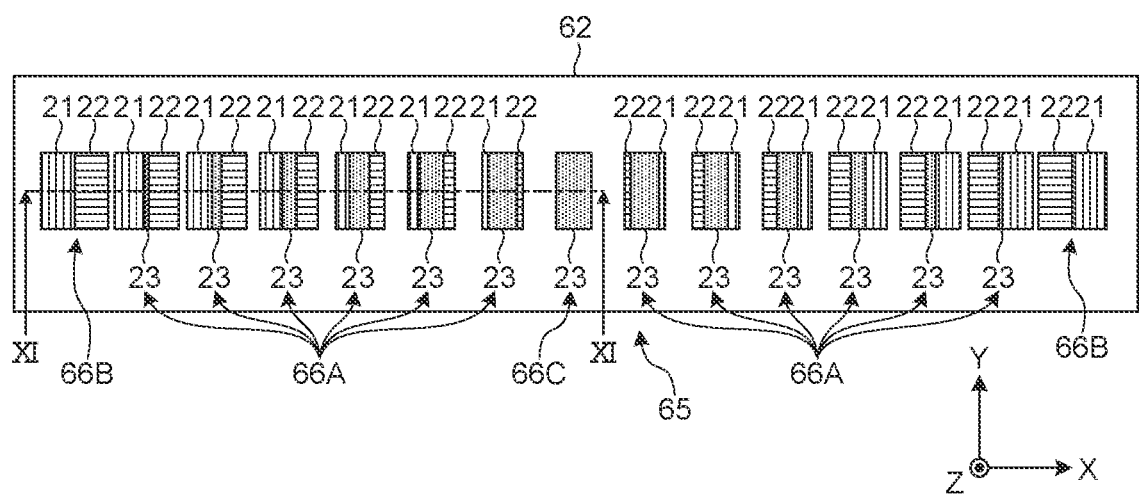
FIG. 10 is a top view illustrating an example of a configuration of alignment marks of the wafer according to the first embodiment.
Figure 11:
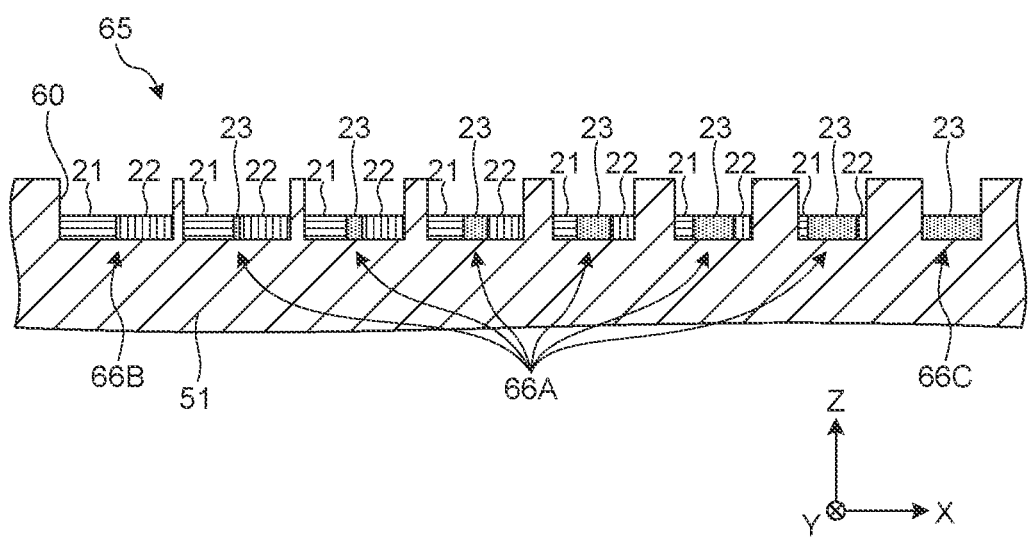
FIG. 11 is a cross-sectional view illustrating the example of the configuration of the alignment marks of the wafer according to the first embodiment, when taken along line XI-XI.

FIG. 10 is a top view illustrating an example of a configuration of the alignment marks 65 of the wafer 51 according to the first embodiment. FIG. 11 is a cross-sectional view illustrating the example of the configuration of the alignment marks 65 of the wafer 51 according to the first embodiment, when taken along line XI-XI.

The alignment marks 65 (second alignment marks) include a plurality of reflectors 66A, 66B, and 66C. The plurality of reflectors 66A, 66B, and 66C are formed on respective lower surfaces of a plurality of recesses 60 formed in the alignment region 62.

The reflector 66A includes a first region 21, a second region 22, and a third region 23. The first region 21, the second region 22, and the third region 23 in the alignment mark 65 have the same configurations as the first region 21, the second region 22, and the third region 23 in the template 1 described above, respectively. That is, the first region 21 of the alignment mark 65 is a region where reflective films 25 reflecting light are arranged in an L/S form in the Y-axis direction (second direction). The second region 22 of the alignment mark 65 is a region where reflective films 25 are arranged in an L/S form in the X-axis direction. The third region 23 of the alignment mark 65 is a region in which reflective films 25 are arranged in a solid or lattice form. In addition, in the first region 21 of the alignment mark 65, the X-polarized light is transmitted with a higher transmittance than the Y-polarized light, and the Y-polarized light is reflected with a higher reflectance than the X-polarized light. In the second region 22 of the alignment mark 65, the Y-polarized light is transmitted with a higher transmittance than the X-polarized light, and the X-polarized light is reflected with a higher reflectance than the Y-polarized light. In the third region 23 of the alignment mark 65, the X-polarized light and the Y-polarized light are reflected.

In addition to the reflector 66A, the reflector 66B and the reflector 66C are included in the alignment marks 65 according to the present embodiment, the reflector 66B including a first region 21 and a second region 22, and the reflector 66C including a third region 23. Hereinafter, the reflectors 66A, 66B, and 66C may be referred to as reflectors 66 when they do not need to be distinguished from each other.

Figure 12:
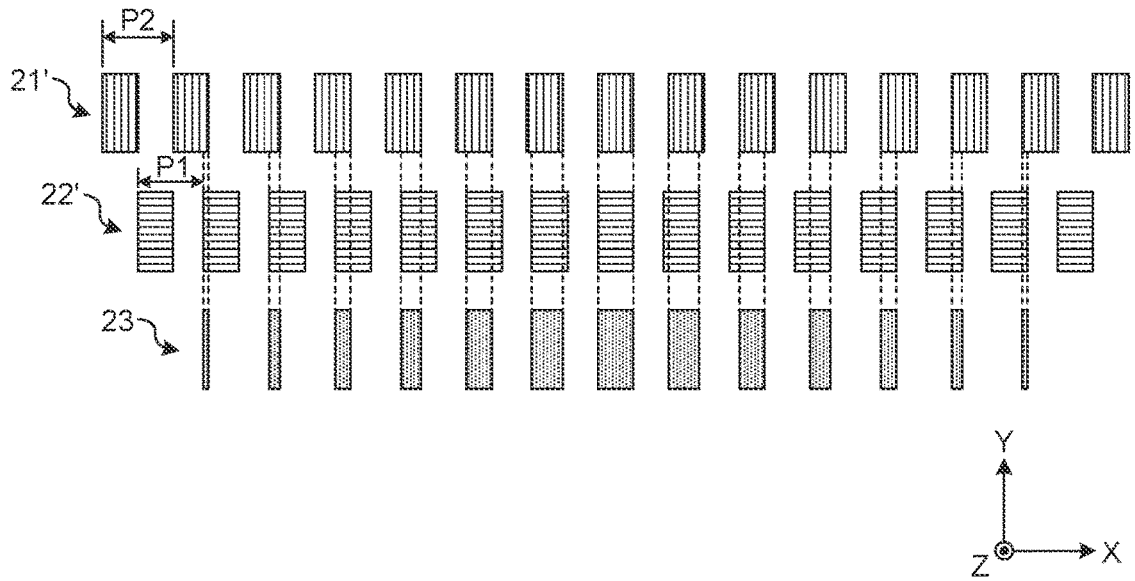
FIG. 12 is a diagram for explaining an example of a relationship between a first region, a second region, and a third region in alignment marks of the wafer according to the first embodiment.

FIG. 12 is a diagram for explaining an example of a relationship between the first region 21, the second region 22, and the third region 23 in the alignment marks 65 of the wafer 51 according to the first embodiment. In FIG. 12, a virtual first region 21' partially corresponding to the first region 21 and a virtual second region 22' partially corresponding to the second region 22 are exemplified. A plurality of virtual first regions 21' are arranged at intervals of the second pitch P2 along the X axis, and a plurality of virtual second regions 21' are arranged at intervals of the first pitch P1 along the X axis. That is, the virtual first regions 21' in the wafer 51 are arranged at the same second pitch P2 as the virtual second regions 22' in the template 1, and the virtual second regions 22' in the wafer 51 are arranged at the same first pitch P1 as the virtual first regions 21' in the template 1.

As illustrated in FIG. 12, when the plurality of virtual first regions 21' and the plurality of virtual second regions 22' overlap each other with the center in the arrangement direction thereof as a reference, a position at which the third region 23 is formed corresponds to a region where the virtual first region 21' and the virtual second region 22' overlap each other. That is, it can be said that the alignment marks 65 of the embodiment illustrated in FIG. 10 include first marks each including the first region 21 and the third region and second marks each including the second region 22 and the third region 23.

According to the alignment mark 65 having the configuration as described above, similarly to the alignment mark 15 of the template 1, the X-polarized light with which the alignment mark 65 is irradiated is reflected in a region including both or one of the first region 21 and the third region 23. Furthermore, the Y-polarized light with which the alignment mark 65 is irradiated is reflected in a region including both or one of the second region 22 and the third region 23.

<Alignment Method>

Hereinafter, an alignment method for aligning the template 1 and the wafer 51 with each other using the alignment marks 15 and 65 as described above will be described.

Figure 13:
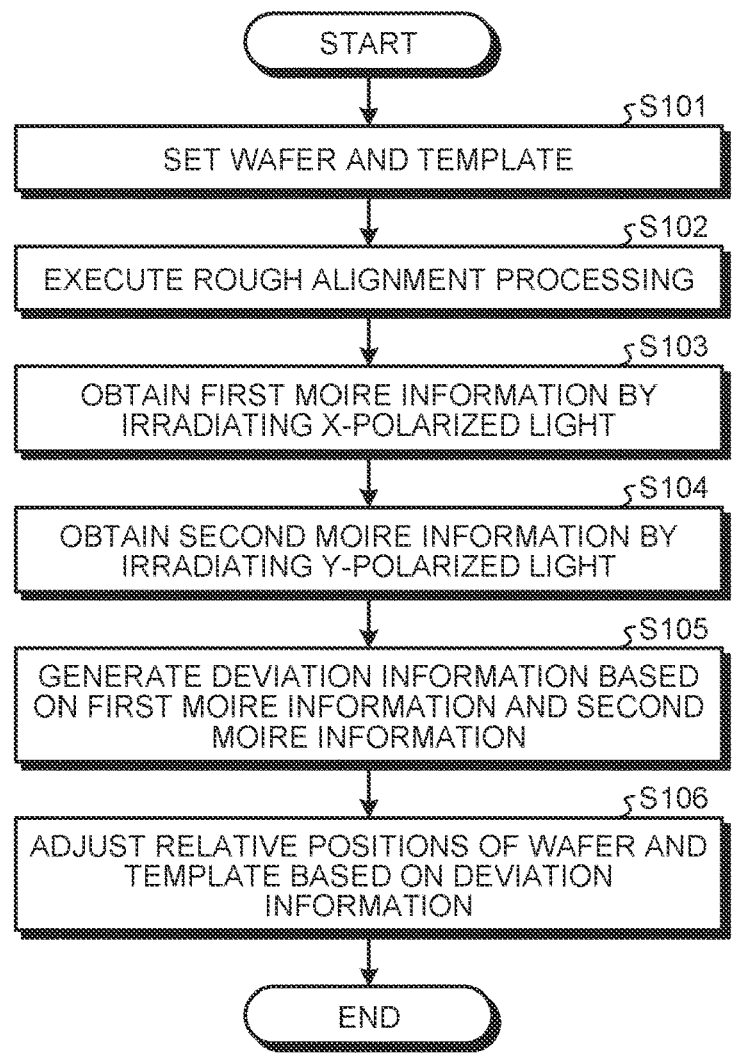
FIG. 13 is a flowchart illustrating an example of an alignment method according to the first embodiment.

FIG. 13 is a flowchart illustrating an example of an alignment method according to the first embodiment. After the wafer 51 and the template 1 are set in a predetermined mechanism (S101), rough alignment processing is executed so that the wafer 51 and the template 1 are arranged at approximately appropriate positions (S102). A specific method of the rough alignment processing is not particularly limited, and may be realized by appropriately using a known technique. The rough alignment processing may be performed, for example, using the alignment marks 15 and 65 or using appropriate marks provided exclusively therefor.

Thereafter, first moire information regarding moire corresponding to X-polarized light (e.g., TM polarized light) is acquired by imaging moire that appears when irradiating the alignment mark 15 with the X-polarized light from above the template 1 (S103). Thereafter, second moire information regarding moire corresponding to Y-polarized light (e.g., TE polarized light) is acquired by imaging moire that appears when irradiating the alignment mark 15 with the Y-polarized light from above the template 1 (S104).

Deviation information indicating a positional deviation between the wafer 51 and the template 1 is generated based on the first moire information and the second moire information (S105), and relative positions of the wafer 51 and the template 1 are adjusted based on the deviation information (S106).

Figure 14:
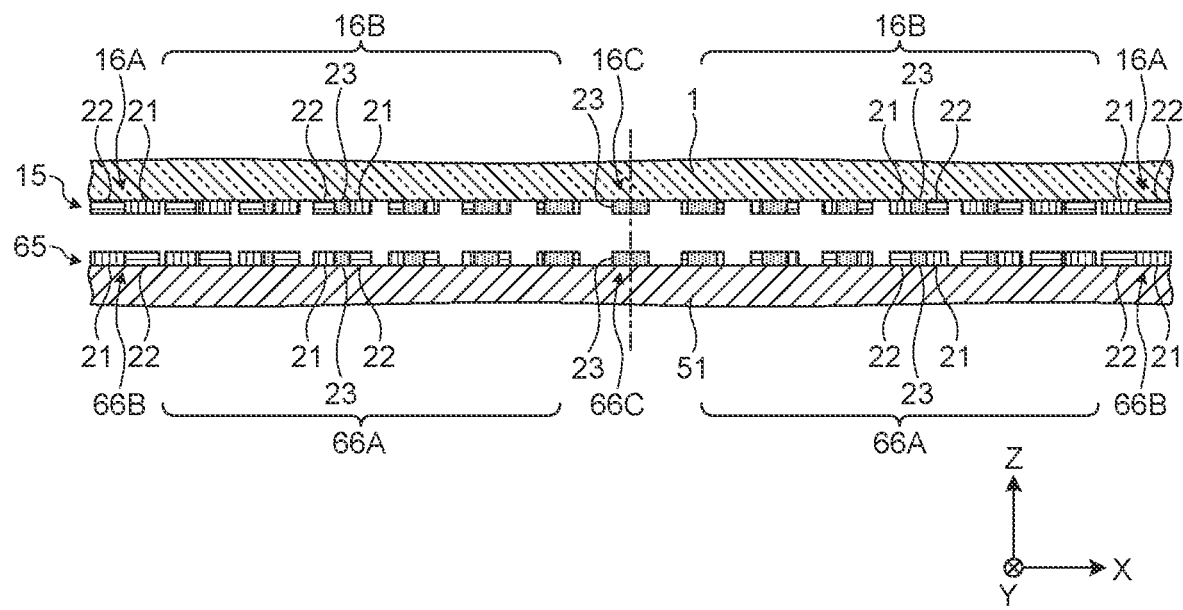
FIG. 14 is a side cross-sectional view illustrating an example of a state in which the wafer and the template are at normal positions in the alignment method according to the first embodiment.

FIG. 14 is a side cross-sectional view illustrating an example of a state in which the wafer 51 and the template 1 are at normal positions in the alignment method according to the first embodiment. Note that, in FIG. 14 and FIGS. 15, 17, 19, and 21 to be described later, the recesses 20 (FIG. 3) of the template 1 and the recesses 60 (FIG. 11) of the wafer 51 are omitted.

As illustrated in FIG. 14, when the wafer 51 and the template 1 are set at normal positions determined as appropriate positions, each of the reflectors 66 of the alignment marks 65 of the wafer 51 and each of the reflectors 16 of the alignment marks 15 of the template 1 face each other in the vertical direction (Z-axis direction). At this time, the first region 21 of the alignment mark 65 of the wafer 51 and the second region 22 of the alignment mark 15 of the template 1 face each other, and the third region 23 of the alignment mark 65 of the wafer 51 and the third region 23 of the alignment mark 15 of the template 1 face each other. In such a state, when inspection light is irradiated from above the template 1, moire appears by light reflected from the reflectors 16 and 66. A light-dark pattern of the moire varies depending on how the reflectors 16 and 66 overlap each other in the vertical direction.

Figure 15:
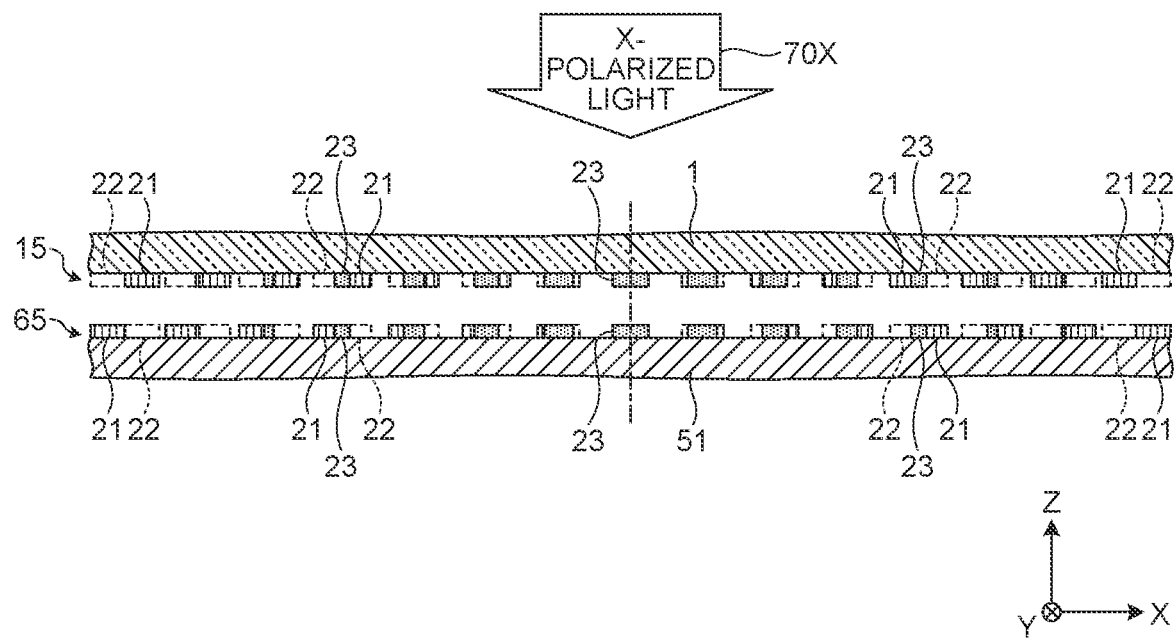
FIG. 15 is a side cross-sectional view illustrating an example of a region where X-polarized light is reflected when the wafer and the template are at normal positions in the first embodiment.

FIG. 15 is a side cross-sectional view illustrating an example of a region where X-polarized light 70X is reflected when the wafer 51 and the template 1 are at normal positions in the first embodiment. As illustrated in FIG. 15, the X-polarized light 70X irradiated from above the template 1 is reflected in the first region 21 and the third region 23 and transmitted in the second region 22. That is, the region where the X-polarized light 70X is reflected is a combined region of the first region 21 and the third region 23. By observing such reflected light of the X-polarized light 70X from above the template 1, first reference moire is observed, the first reference moire appearing when the wafer 51 and the template 1 are at normal positions and are irradiated with the X-polarized light 70X.

Figure 16:
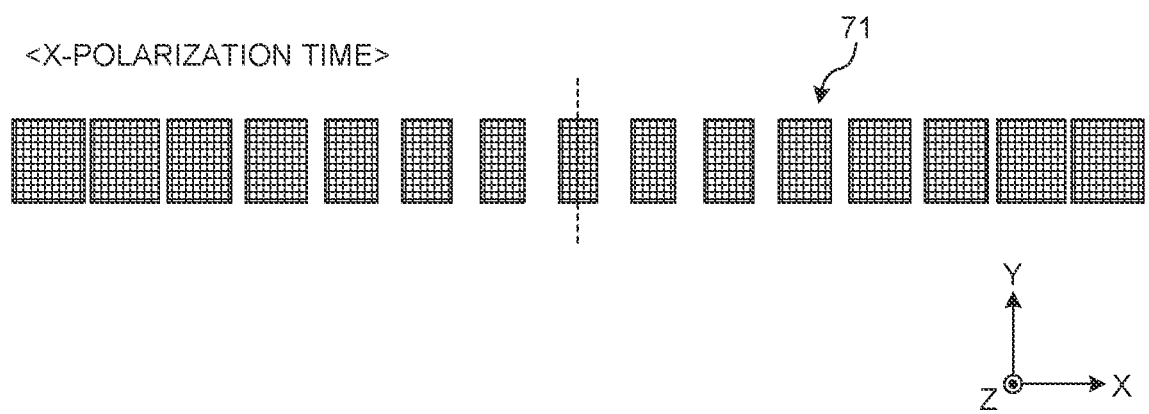
FIG. 16 is a diagram illustrating an example of first reference moire according to the first embodiment.

FIG. 16 is a diagram illustrating an example of the first reference moire 71 according to the first embodiment. In FIG. 16, the first reference moire 71 observed from above the template 1 is exemplified. In FIG. 16, a region depicted in a lattice form corresponds to a reflection region where the first region 21 and the third region 23 are combined in the top view. In the light-dark pattern of the first reference moire 71, the region corresponding to the reflection region where the first region 21 and the third region 23 are combined is light, and the other regions (such as a region corresponding to the second region 22) are dark.

Figure 17:
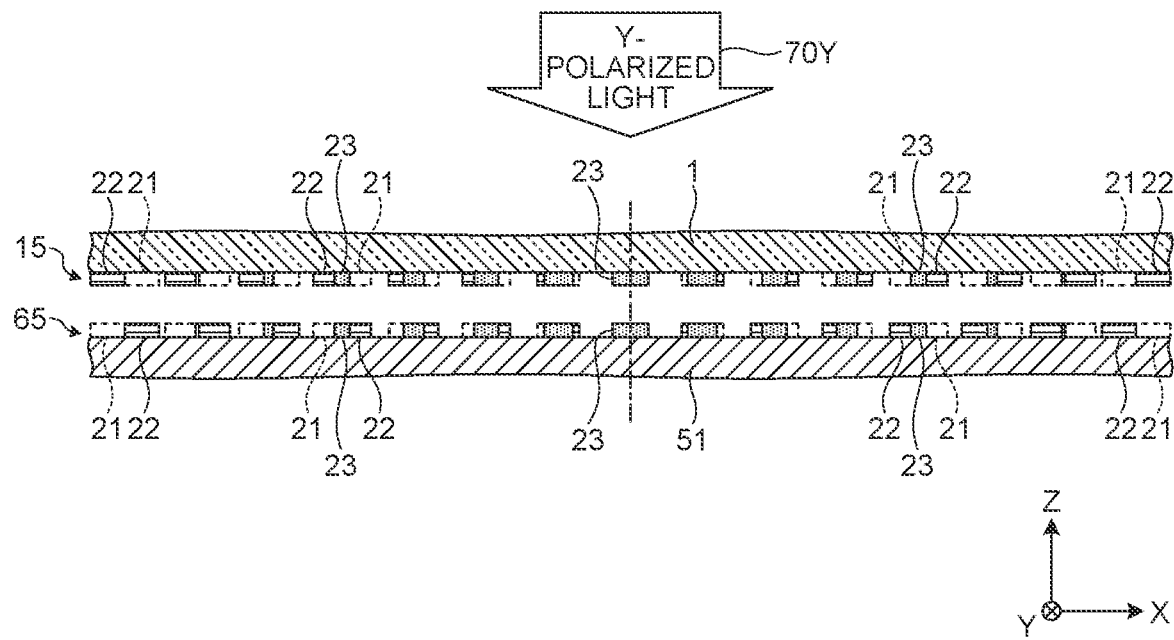
FIG. 17 is a side cross-sectional view illustrating an example of a region where Y-polarized light is reflected when the wafer and the template are at normal positions in the first embodiment.

FIG. 17 is a side cross-sectional view illustrating an example of a region where Y-polarized light 70Y is reflected when the wafer 51 and the template 1 are at normal positions in the first embodiment. As illustrated in FIG. 17, the Y-polarized light 70Y irradiated from above the template 1 is reflected in the second region 22 and the third region 23 and transmitted in the first region 21. That is, the region where the Y-polarized light 70Y is reflected is a combined region of the second region 22 and the third region 23. By observing such reflected light of the Y-polarized light 70Y from above the template 1, second reference moire is observed, the second reference moire appearing when the wafer 51 and the template 1 are at normal positions and are irradiated with the Y-polarized light 70Y.

Figure 18:
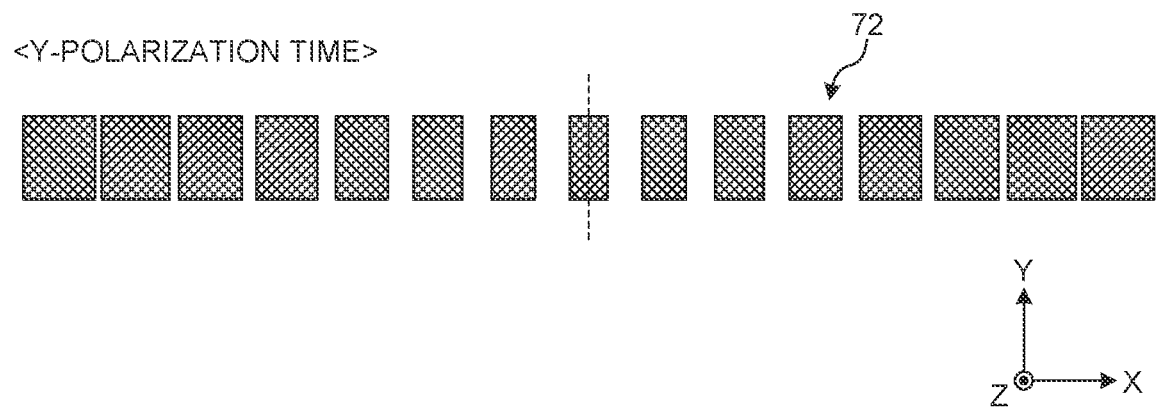
FIG. 18 is a diagram illustrating an example of second reference moire according to the first embodiment.

FIG. 18 is a diagram illustrating an example of the second reference moire 72 according to the first embodiment. In FIG. 18, the second reference moire 72 observed from above the template 1 is exemplified. In FIG. 18, a region depicted in an oblique lattice corresponds to a reflection region where the second region 22 and the third region 23 are combined in the top view. In the light-dark pattern of the second reference moire 72, the region corresponding to the reflection region where the second region 22 and the third region 23 are combined is light, and the other regions (such as a region corresponding to the first region 21) are dark.

Figure 19:
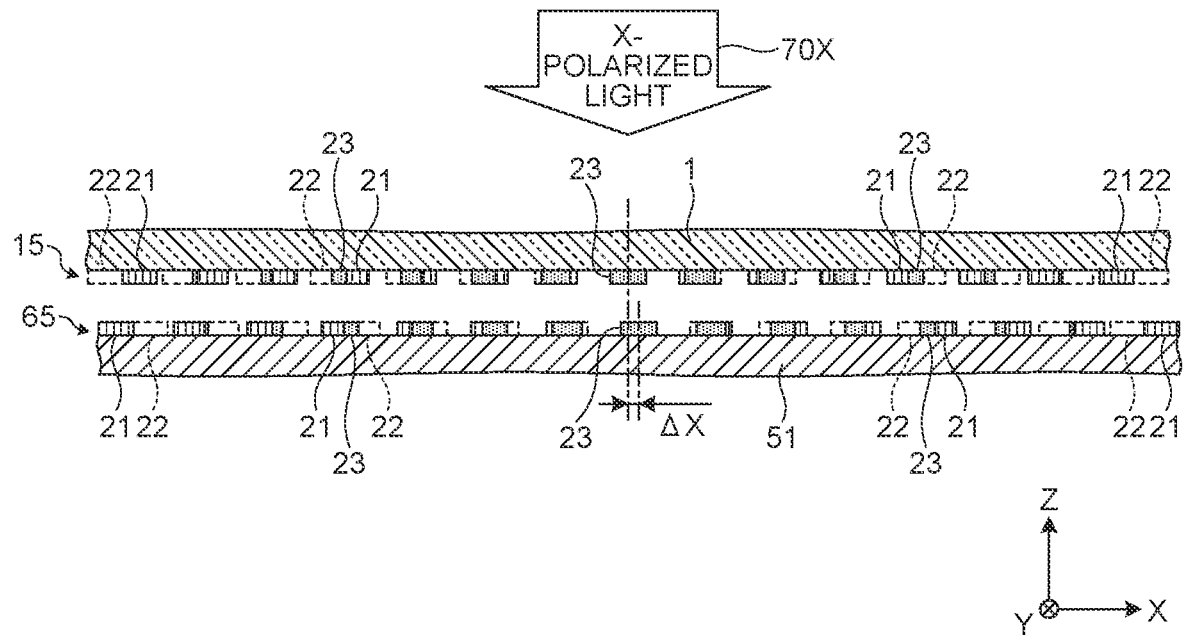
FIG. 19 is a side cross-sectional view illustrating an example of a region where X-polarized light is reflected when the wafer and the template are at non-normal positions in the first embodiment.

FIG. 19 is a side cross-sectional view illustrating an example of a region where X-polarized light 70X is reflected when the wafer 51 and the template 1 are at non-normal positions in the first embodiment. FIG. 19 exemplifies a state in which the wafer 51 is deviated from the normal position to the right side of the drawing in the X-axis direction.

Figure 20:
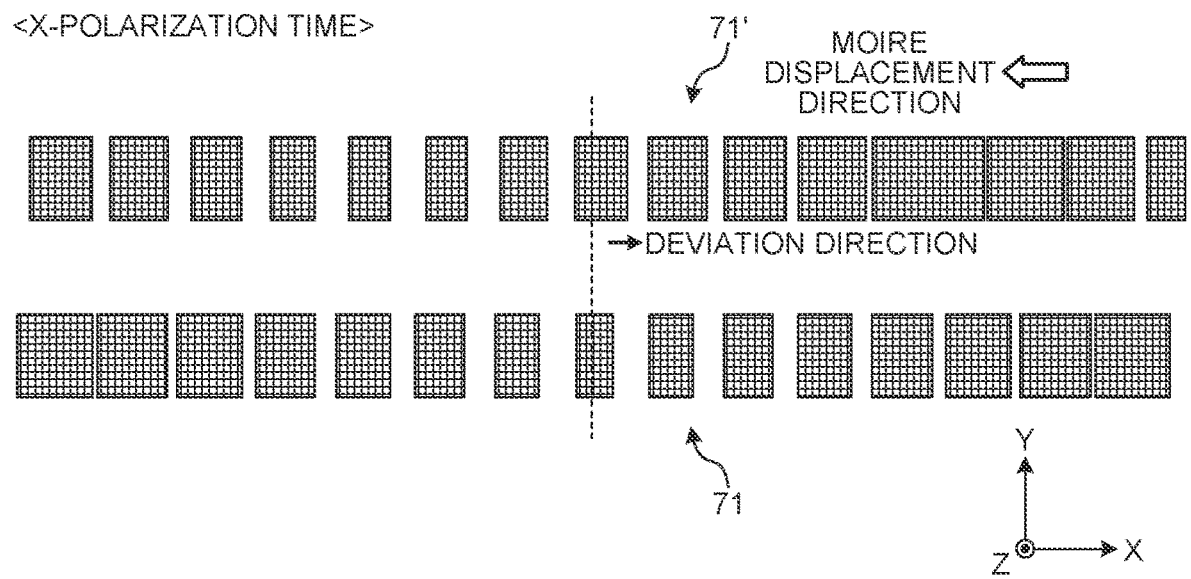
FIG. 20 is a diagram illustrating an example in which first moire appearing when the wafer and the template are at the non-normal positions and irradiated with the X-polarized light is compared with the first reference moire in the first embodiment.

FIG. 20 is a diagram illustrating an example in which first moire 71' appearing when the wafer 51 and the template 1 are at the non-normal positions and irradiated with the X-polarized light 70X is compared with the first reference moire 71 in the first embodiment. FIG. 20 illustrates the state illustrated in FIG. 19, that is, the first moire 71' appearing when the wafer 51 is deviated from the normal position to the right side of the drawing along the X axis and irradiated with the X-polarized light 70X. As illustrated in FIG. 20, a direction in which a light-dark pattern of the first moire 71' is displaced (moire displacement direction) is opposite to the direction in which the wafer 51 is deviated.

Figure 21:
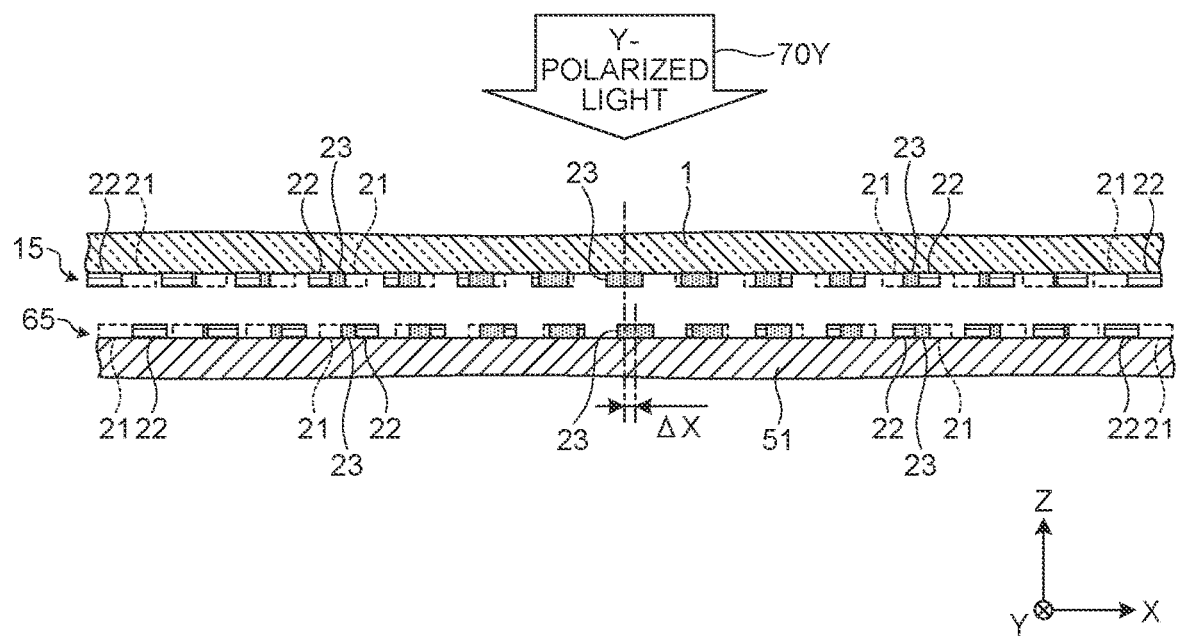
FIG. 21 is a side cross-sectional view illustrating an example of a region where Y-polarized light is reflected when the wafer and the template are at non-normal positions in the first embodiment.

FIG. 21 is a side cross-sectional view illustrating an example of a region where Y-polarized light 70Y is reflected when the wafer 51 and the template 1 are at non-normal positions in the first embodiment. FIG. 21 exemplifies a state in which the wafer 51 is deviated from the normal position to the right side of the drawing in the X-axis direction.

Figure 22:
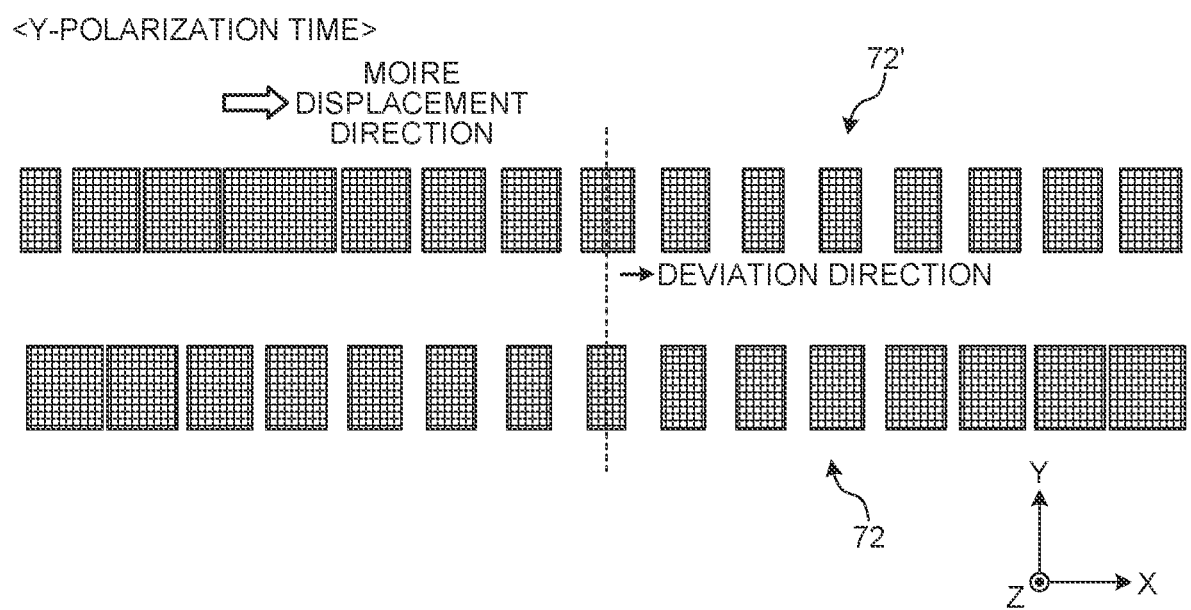
FIG. 22 is a diagram illustrating an example in which second moire appearing when the wafer and the template are at the non-normal positions and irradiated with the Y-polarized light is compared with the second reference moire in the first embodiment.

FIG. 22 is a diagram illustrating an example in which second moire 72' appearing when the wafer 51 and the template 1 are at the non-normal positions and irradiated with the Y-polarized light 70Y is compared with the second reference moire 72 in the first embodiment. FIG. 22 illustrates the state illustrated in FIG. 21, that is, the second moire 72' appearing when the wafer 51 is deviated from the normal position to the right side of the drawing along the X axis and irradiated with the Y-polarized light 70Y. As illustrated in FIG. 22, a direction in which a light-dark pattern of the second moire 72' is displaced (moire displacement direction) conforms to the direction in which the wafer 51 is deviated.

As described above, even though the direction of deviation between the relative positions of the wafer 51 and the template 1 is identical, the moire displacement direction of the first moire 71' appearing according to the X-polarized light 70X and the moire displacement direction of the second moire 72' appearing according to the Y-polarized light 70Y are opposite to each other. In this way, by analyzing the two types of moire 71' and 72' obtained by irradiating the X-polarized light 70X and the Y-polarized light 70Y in a switching manner, the positional deviation can be detected with improved accuracy. Furthermore, by overlapping the first region 21 and the second region 22 each other and arranging the third region 23 in the region where the first region 21 and the second region 22 overlap each other as described above, the areas of the alignment marks 15 and 65 can be reduced. As a result, alignment with high accuracy can be realized using the alignment marks 15 and 65 smaller than the conventional alignment marks.

<Semiconductor Manufacturing Apparatus>

Hereinafter, a semiconductor manufacturing apparatus for manufacturing a semiconductor device by performing imprint processing using the template 1, the wafer 51 (workpiece), and the alignment method as described above will be described.

Figure 23:
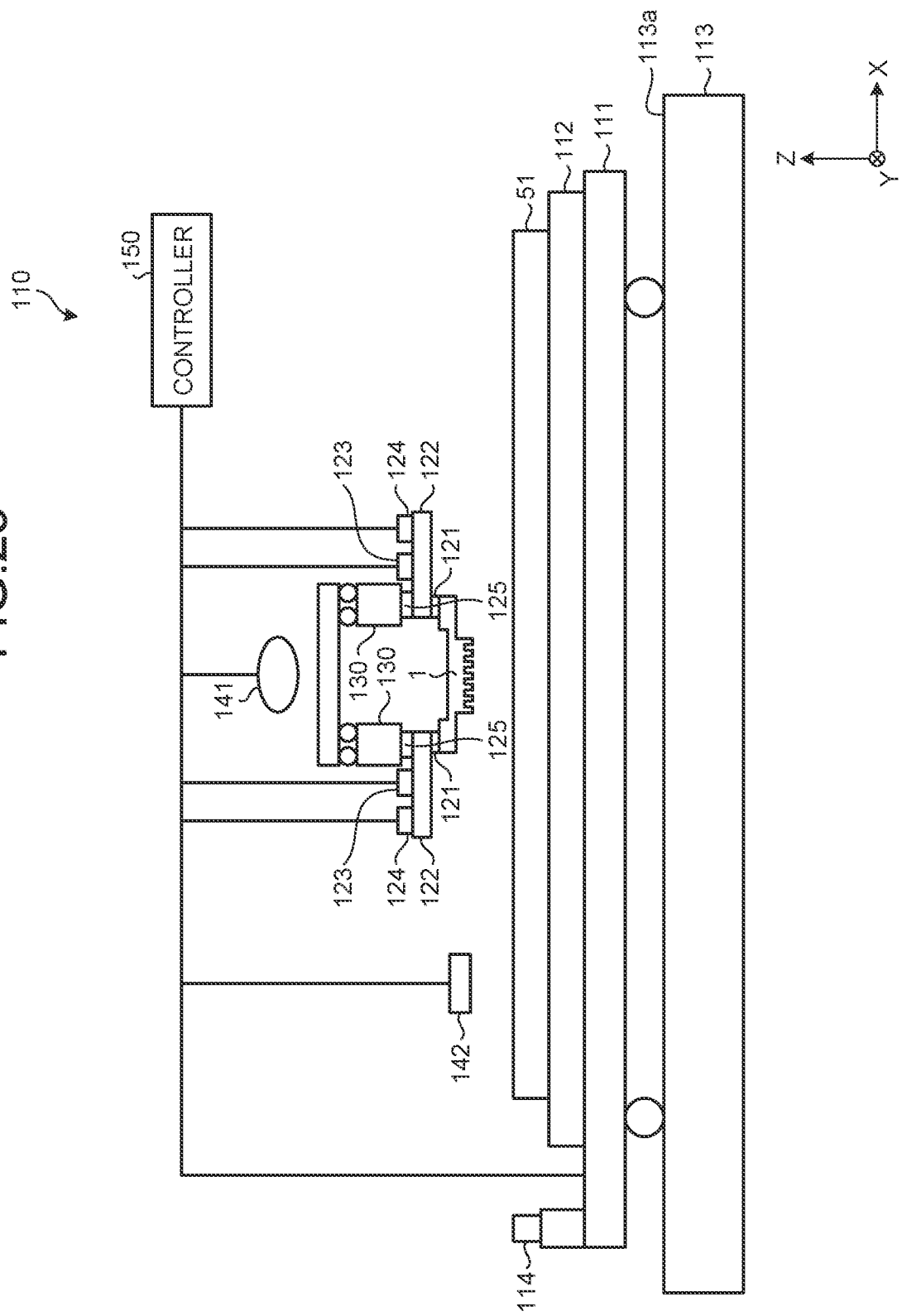
FIG. 23 is a diagram illustrating an example of a configuration of a semiconductor manufacturing apparatus according to the first embodiment.

FIG. 23 is a diagram illustrating an example of a configuration of the semiconductor manufacturing apparatus 110 according to the first embodiment. The semiconductor manufacturing apparatus 110 includes a substrate stage 111. A chuck 112 is provided on the substrate stage 111. The chuck 112 holds the wafer 51. The chuck 112 holds the wafer 51 by an appropriate method such as vacuum suction.

The substrate stage 111 is provided to be movable onto a stage surface plate 113. The substrate stage 111 is movable along an upper surface 113*a* (X-Y plane) of the stage surface plate 113 and is provided to be movable in the Z-axis direction orthogonal to the X-Y plane. In addition, the substrate stage 111 is preferably provided to be rotatable about each of the X axis, the Y axis, and the Z axis.

A reference mark stand 114 is provided on the substrate stage 111. Although not illustrated, a reference mark serving as a reference position of the semiconductor manufacturing apparatus 110 is provided on the reference mark stand 114. The reference mark may be, for example, a checkered diffraction grating or the like. The reference mark is used to calibrate an alignment scope 130, preliminarily position the template 1 (rough alignment processing), and the like. The reference mark can be an origin on the substrate stage 111. In this case, an X coordinate and a Y coordinate of the wafer 51 set on the substrate stage 111 can be treated as coordinates with the position of the reference mark stand 114 as the origin.

The semiconductor manufacturing apparatus 110 includes a template stage 121. The template stage 121 fixes the template 1. The template stage 121 holds a peripheral portion of the template 1 by an appropriate method such as vacuum suction. The template stage 121 is attached to a base 122.

A correction mechanism 123 and a pressurizer 124 are provided on the base 122. The correction mechanism 123 includes, for example, a mechanism finely adjusting a position (posture) of the template 1 when receiving an instruction from a controller 150. The pressurizer 124 applies stress to side surfaces of the template 1 to correct distortion of the template 1. The pressurizer 124 pressurizes the template 1 from the four side surfaces toward the center of the template 1. As a result, a size of a pattern to be transferred can be corrected (correction of magnification). For example, the pressurizer 124 pressurizes the template 1 with a predetermined stress when receiving an instruction from the controller 150.

The base 122 is attached to an alignment stage 125. The alignment stage 125 moves the base 122 in the X-axis direction or the Y-axis direction in order to align the template 1 and the wafer 51 with each other. In addition, the alignment stage 125 rotates the base 122 along the X-Y plane.

The alignment scope 130 is a device for observing moire that appears when irradiating the alignment marks 15 provided on the template 1 and the alignment marks 65 provided on the wafer 51 with inspection light for alignment. The alignment scope 130 includes a mechanism irradiating inspection light, a mechanism receiving light reflected from the template 1, a mechanism photoelectrically converting the received light, and the like. Based on the information regarding the moire observed (imaged) by the alignment scope 130, the relative positions of the wafer 51 and the template 1 are adjusted to the normal positions.

The semiconductor manufacturing apparatus 110 includes a processing light source 141 and a coating unit 142. The processing light source 141 irradiates, for example, electromagnetic waves in an ultraviolet wavelength band. The processing light source 141 causes a switch of the template 1 to a light irradiated state or a light non-irradiated state when receiving an instruction from the controller 150. The coating unit 142 is a mechanism coating a resist on the wafer 51. The coating unit 142 may be, for example, an inkjet head having a nozzle. The coating unit 42 drops a resist to a predetermined position on the wafer 51 when receiving an instruction from the controller 150.

The semiconductor manufacturing apparatus 110 includes the controller 150. The controller 150 overall controls the semiconductor manufacturing apparatus 110. The controller 150 executes a control of the alignment scope 130, alignment processing for aligning the wafer 51 and the template 1 with each other, a control of the coating unit 142, a control of the processing light source 141, and the like according to programs in which respective processing details are written. In the alignment processing, the controller 150 controls the substrate stage 111, the base 122, the alignment stage 125, and the like, on the basis of the information regarding the moire acquired by the alignment scope 130, so that the wafer 51 and the template 1 are positioned at the normal positions.

Configuration Example of Alignment Scope

Hereinafter, a configuration example of the alignment scope 130 will be described with reference to FIGS. 24 to 26.

Figure 24:
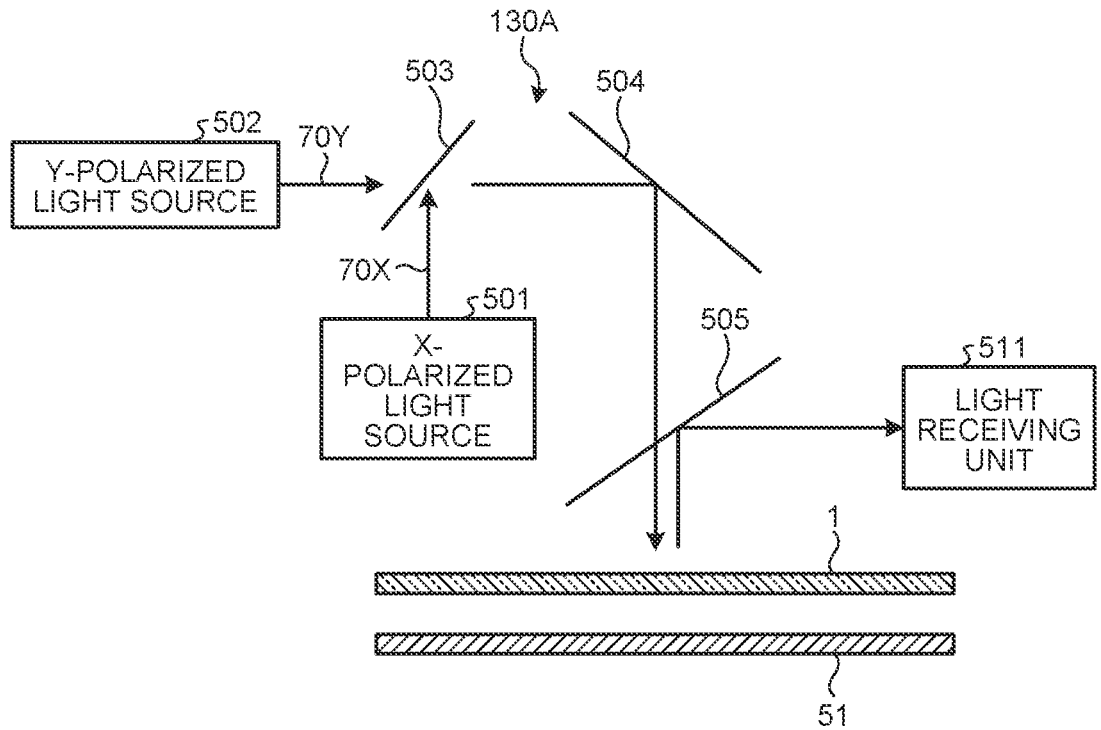
FIG. 24 is a diagram schematically illustrating a configuration of an alignment scope according to a first example of the first embodiment.

FIG. 24 is a diagram schematically illustrating a configuration of an alignment scope 130A according to a first example of the first embodiment. The alignment scope 130A according to the present example includes an X-polarized light source 501, a Y-polarized light source 502, a transmission reflection plate 503, a first reflection plate 504, a second reflection plate 505, and a light receiving unit 511.

The X-polarized light source 501 irradiates X-polarized light 70X (e.g., TM polarized light). The Y-polarized light source 502 irradiates Y-polarized light 70Y (e.g., TE polarized light). The transmission reflection plate 503 transmits the Y-polarized light 70Y and reflects the X-polarized light 70X. The first reflection plate 504 and the second reflection plate 505 reflect the X-polarized light 70X and the Y-polarized light 70Y. The light receiving unit 511 photoelectrically converts incident light and generates information regarding moire appearing on the template 1.

The Y-polarized light 70Y irradiated from the Y-polarized light source 502 is transmitted through the transmission reflection plate 503 and propagates to the first reflection plate 504, and the X-polarized light 70X irradiated from the X-polarized light source 501 is reflected by the transmission reflection plate 503 and propagates to the first reflection plate 504. The X-polarized light 70X or the Y-polarized light 70Y from the transmission reflection plate 503 is reflected by the first reflection plate 504 and irradiated to an upper surface of the template 1. Light reflected from the template 1 (reflected light of the X-polarized light 70X or reflected light of the Y-polarized light 70Y) is reflected by the second reflection plate 505 and received by the light receiving unit 511. The information regarding the moire generated by the light receiving unit 511 is output to a control mechanism such as the controller 150.

Figure 25:
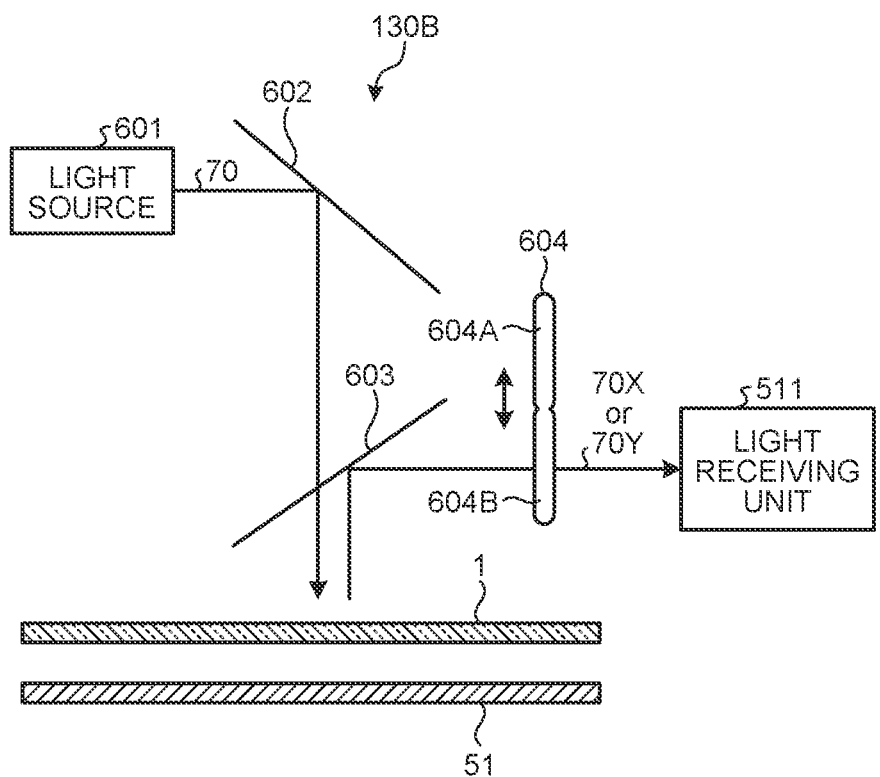
FIG. 25 is a diagram schematically illustrating a configuration of an alignment scope according to a second example of the first embodiment.

FIG. 25 is a diagram schematically illustrating a configuration of an alignment scope 130B according to a second example of the first embodiment. The alignment scope 130B according to the present example includes a light source 601, a first reflection plate 602, a second reflection plate 603, a polarizing filter 604, and a light receiving unit 511.

The light source 601 irradiates inspection light 70 in a visible light band. The first reflection plate 602 reflects the inspection light 70. The second reflection plate 603 reflects light reflected from the template 1. The polarizing filter 604 includes an X-polarization section 604A and a Y-polarization section 604B. The X-polarization section 604A polarizes incident light into X-polarized light 70X. The Y-polarization section 604B polarizes incident light into Y-polarized light 70Y. The polarizing filter 604 is configured to be displaced by a predetermined drive mechanism to switch which one of the X-polarization section 604A and the Y-polarization section 604B is disposed on an optical path. The light receiving unit 511 photoelectrically converts incident light and generates information regarding moire appearing on the template 1.

The inspection light 70 irradiated from the light source 601 is reflected by the first reflection plate 602 and irradiated to an upper surface of the template 1. Light reflected from the template 1 is reflected by the second reflection plate 603, transmitted through either the X-polarization section 604A or the Y-polarization section 604B of the polarizing filter 604, and polarized to either X-polarized light 70X or Y-polarized light 70Y. The light receiving unit 511 receives the X-polarized light 70X or the Y-polarized light 70Y from the polarizing filter 604. The information regarding the moire generated by the light receiving unit 511 is output to a control mechanism such as the controller 150.

Figure 26:
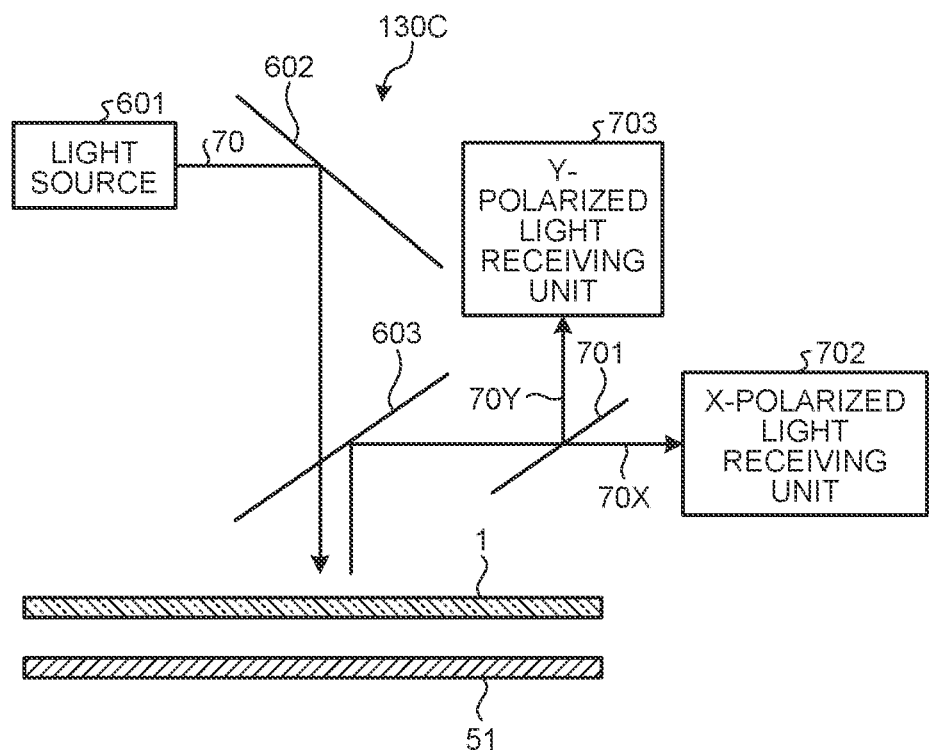
FIG. 26 is a diagram schematically illustrating a configuration of an alignment scope according to a third example of the first embodiment.

FIG. 26 is a diagram schematically illustrating a configuration of an alignment scope 130C according to a third example of the first embodiment. The alignment scope 130C according to the present example includes a light source 601, a first reflection plate 602, a second reflection plate 603, a polarization spectroscopic plate 701, an X-polarized light receiving unit 702, and a Y-polarized light receiving unit 703.

The light source 601 irradiates inspection light 70 in a visible light band. The first reflection plate 602 reflects the inspection light 70. The second reflection plate 603 reflects light reflected from the template 1. The polarization spectroscopic plate 701 divides the light reflected from the template 1 into X-polarized light 70X and Y-polarized light 70Y. The X-polarized light receiving unit 702 photoelectrically converts the X-polarized light 70X and generates information regarding moire appearing on the template 1. The Y-polarized light receiving unit 703 photoelectrically converts the Y-polarized light 70Y and generates information regarding moire appearing on the template 1.

The inspection light 70 irradiated from the light source 601 is reflected by the first reflection plate 602 and irradiated to an upper surface of the template 1. The light reflected from the template 1 is reflected by the second reflection plate 603 and divided into the X-polarized light 70X and the Y-polarized light 70Y by the polarization spectroscopic plate 701. The X-polarized light receiving unit 702 receives the X-polarized light 70X, and the Y-polarized light receiving unit 703 receives the Y-polarized light 70Y. The information regarding the moire generated by the X-polarized light receiving unit 702 and the Y-polarized light receiving unit 703 is output to a control mechanism such as the controller 150.

In the configuration as described above, by irradiating the alignment marks 15 and 65 with the X-polarized light 70X and the Y-polarized light 70Y in a switching manner, the information regarding the two types of moire (moire corresponding to the X-polarized light and moire corresponding to the Y-polarized light) can be acquired. Furthermore, by overlapping the first region 21 and the second region 22 each other and arranging the third region 23 in the region where the first region 21 and the second region 22 overlap each other as described above, the areas of the alignment marks 15 and 65 can be reduced. As a result, alignment with high accuracy can be realized using the alignment marks 15 and 65 smaller than the conventional alignment marks.

Note that, although it has been described above that the first region 21 and the second region 22 are formed in the L/S form, the configurations of the first region 21 and the second region 22 are not limited thereto. For example, the first region 21 and the second region 22 may be formed in a checkered form. In addition, the first region 21 and the second region 22 in one of the template 1 and the wafer 51 may be formed in the L/S form, and the first region 21 and the second region 22 in the other one of the template 1 and the wafer 51 may be formed in the checkered form. In addition, the first region 21 and the second region 22 in both the template 1 and the wafer 51 may be formed in the checkered form.

Second Embodiment

Hereinafter, a technique related to alignment for adjusting a self-position of one workpiece (e.g., a wafer) in a case where a plurality of processes are executed with respect to the workpiece will be described.

<Semiconductor Manufacturing Process>

Figure 27:
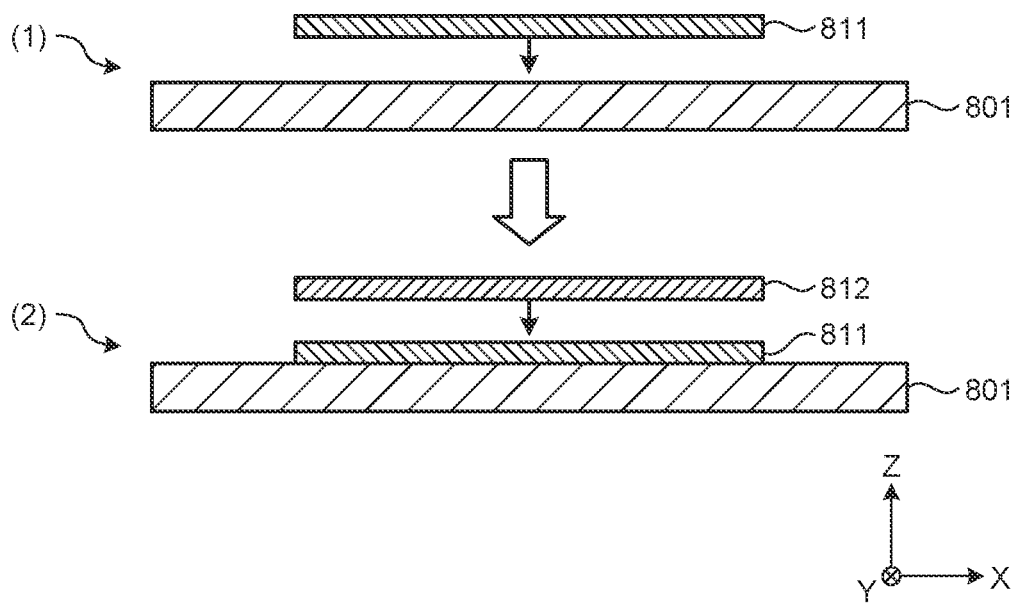
FIG. 27 is a side cross-sectional view illustrating an example of a semiconductor manufacturing process according to a second embodiment.

FIG. 27 is a side cross-sectional view illustrating an example of a semiconductor manufacturing process according to a second embodiment. The semiconductor manufacturing process exemplified here includes a first step (1) of forming a first film 811 on a wafer 801 as an example of a workpiece, and a second step (2) of forming a second film 812 on the first film 811. Before executing the first step (1) and before executing the second step (2), alignment processing for arranging the wafer 801 at a predetermined normal position is executed.

<Configuration of Workpiece>

Figure 28:
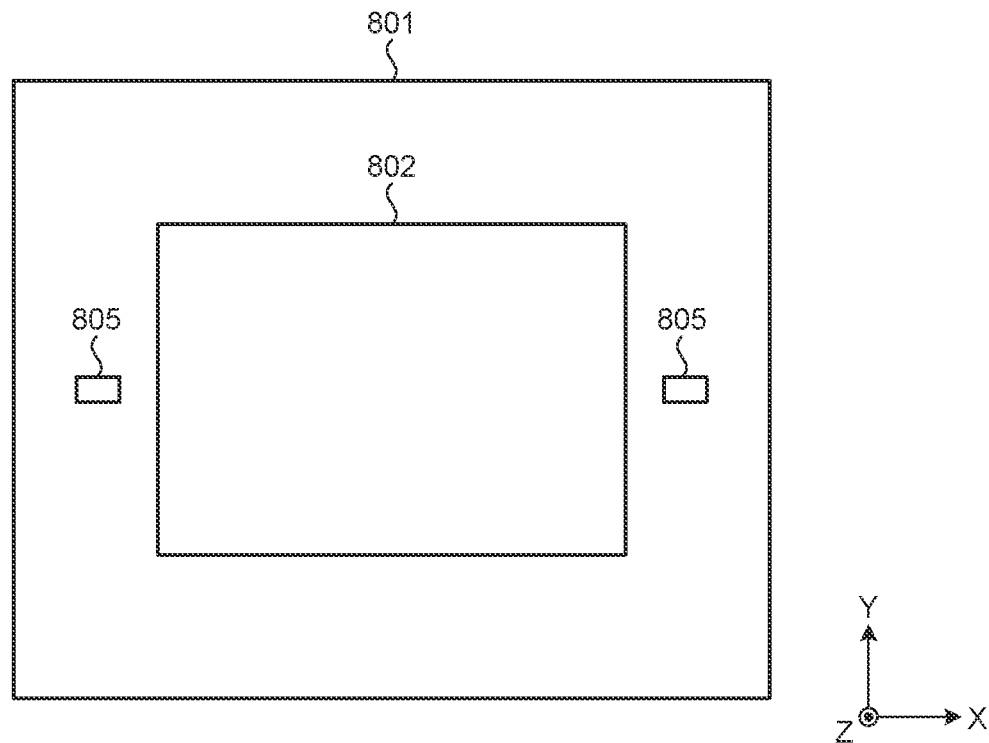
FIG. 28 is a top view illustrating an example of a configuration of a wafer according to the second embodiment.

FIG. 28 is a top view illustrating an example of a configuration of the wafer 801 according to the second embodiment. As illustrated in FIG. 28, a device region 802 and alignment regions 805 are formed on an upper surface (surface to be processed) of the wafer 801 according to the present embodiment.

The device region 802 is a region where the plurality of films 811 and 812 as described above are formed. Alignment marks for positioning the wafer 801 at the normal position before executing each of steps (1) and (2) are formed in the alignment regions 805. Note that the alignment regions 805 may be formed in the device region 802.

Figure 29:
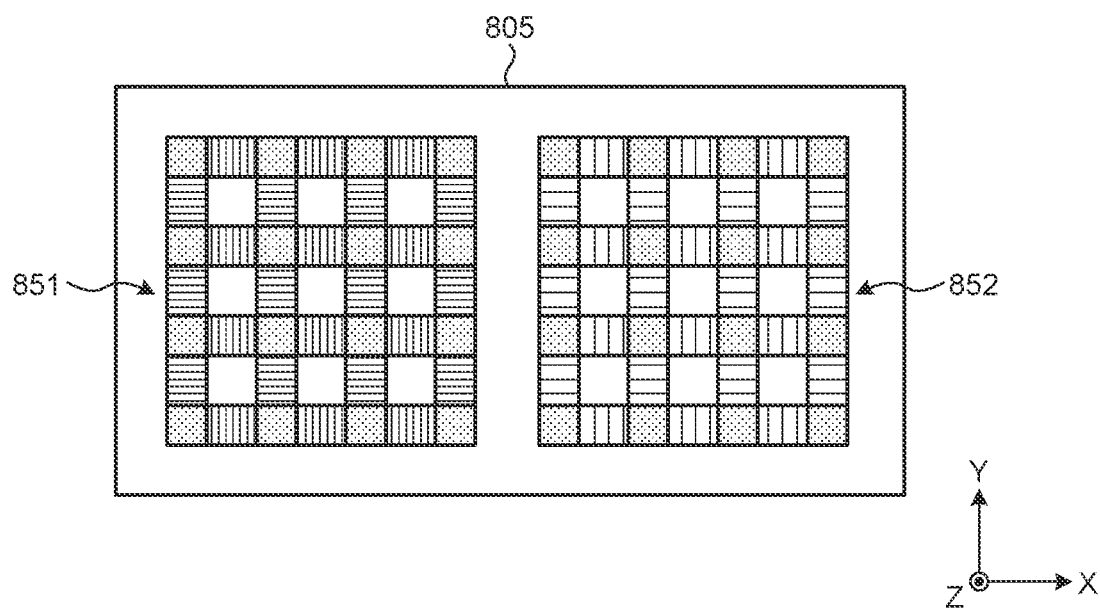
FIG. 29 is a top view illustrating an example of a configuration of alignment marks according to the second embodiment.

FIG. 29 is a top view illustrating an example of a configuration of the alignment marks 851 and 852 according to the second embodiment. In the alignment regions 805 according to the present embodiment, a first alignment mark 851 for detecting a positional deviation of the wafer 801 in the X direction and a second alignment mark 852 for detecting a positional deviation of the wafer 801 in the Y direction are formed.

Figure 30:
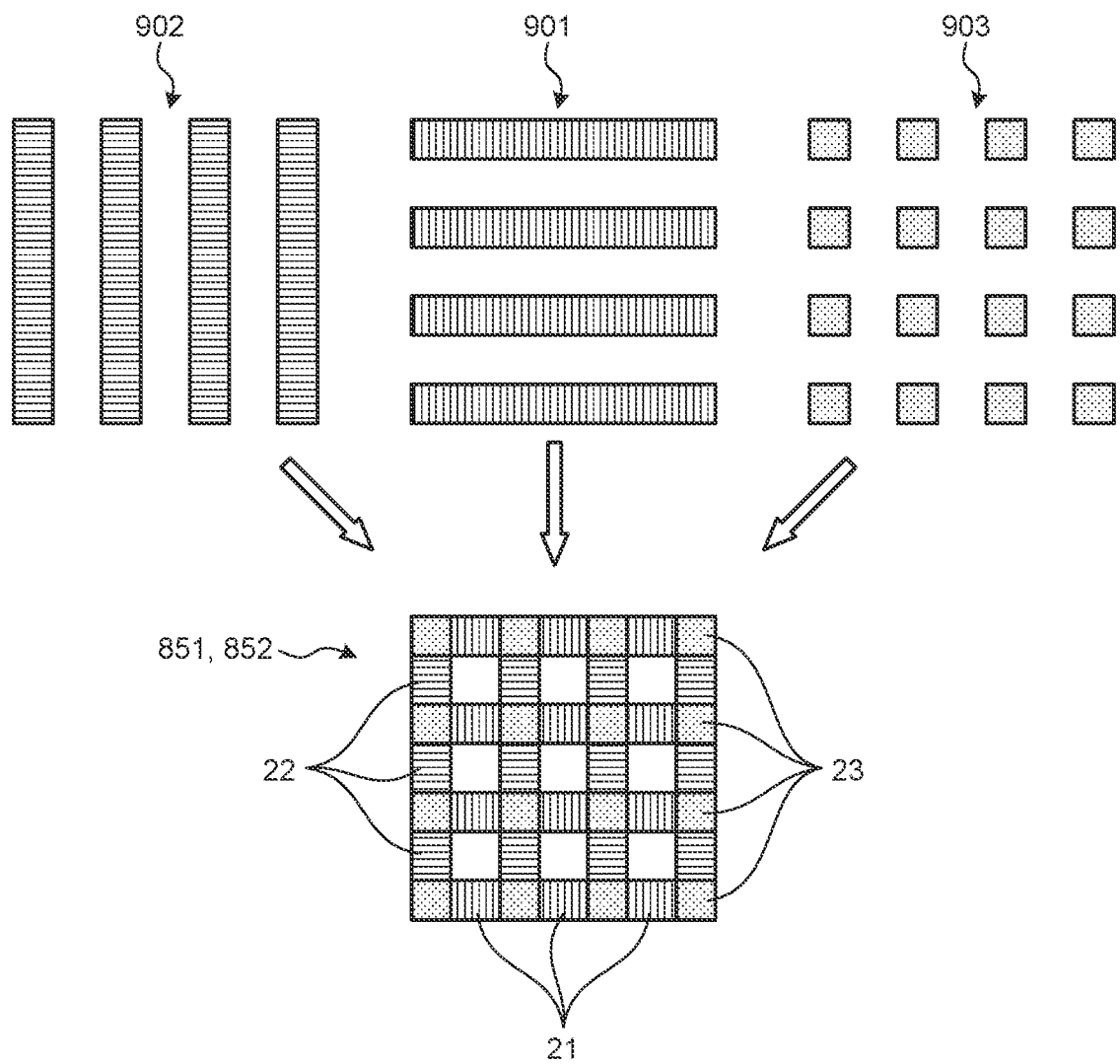
FIG. 30 is a diagram illustrating an example of a configuration of alignment marks according to the second embodiment.

FIG. 30 is a diagram for illustrating the example of the configuration of the alignment marks 851 and 852 according to the second embodiment. As illustrated in FIG. 30, each of the first alignment mark 851 and the second alignment mark 852 includes a first region 901, a second region 902, and a third region 903. Similarly to the first region 21 according to the first embodiment, the first region 901 is a region in which reflective films reflecting light are arranged in an L/S form in the Y-axis direction. Similarly to the second region 22 according to the first embodiment, the second region 902 is a region where the reflective films are arranged in an L/S form in the X-axis direction. The third region 903 is a region in which reflective films are arranged in a solid or lattice form. In addition, in the first region 901, the X-polarized light is transmitted with a higher transmittance than the Y-polarized light, and the Y-polarized light is reflected with a higher reflectance than the X-polarized light. In the second region 902, the Y-polarized light is transmitted with a higher transmittance than the X-polarized light, and the X-polarized light is reflected with a higher reflectance than the Y-polarized light. In the third region 903, the X-polarized light and the Y-polarized light are reflected.

The first region 901 is disposed to extend in the X-axis direction. The second region 902 is disposed to be orthogonal to the extending direction of the first region 901. The third region 903 is disposed in a region where the first region 901 and the second region 902 overlap each other in the top view.

By irradiating the alignment marks 851 and 852 having the configuration as described above with the X-polarized light and the Y-polarized light in a switching manner, two types of image information can be acquired. Furthermore, by overlapping the first region 901 and the second region 902 each other and arranging the third region 903 in the region where the first region 901 and the second region 902 overlap each other as described above, the areas of the alignment marks 851 and 852 can be reduced. As a result, alignment with high accuracy can be realized using the alignment marks 851 and 852 smaller than the conventional alignment marks.

Note that, in the first embodiment and the second embodiment, the material of the reflective films is not particularly limited. In addition, the light-reflected region and the light-transmitted region in the embodiments may have opposite configurations, or may be formed of any material that can cause a phase difference therebetween. That is, when the alignment regions 12 and 62 are entirely constituted by reflection regions, the third region becomes a transmission region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
an alignment mark,
wherein the alignment mark includes first marks arranged at a first pitch in a first direction, and second marks arranged at a second pitch in the first direction,
at least one of the first marks includes a first region and a third region,
at least one of the second marks includes a second region and the third region,
the first region has first patterns arranged in a line-and-space form in the first direction,
the second region has second patterns arranged in a line-and-space form in a second direction orthogonal to the first direction,
wherein
in the first region, first polarized light having electric fields vibrating along a first plane including the first direction is transmitted with a higher transmittance than second polarized light having electric fields vibrating along a second plane orthogonal to the first plane, and the second polarized light is reflected with a higher reflectance than the first polarized light, and
in the second region, the second polarized light is transmitted with a higher transmittance than the first polarized light, and the first polarized light is reflected with a higher reflectance than the second polarized light.

2. The template according to claim 1, wherein the third region includes third patterns arranged in a solid or lattice form.

3. The template according to claim 2, wherein the first pitch and the second pitch are 2000 nm or less.

4. The template according to claim 3, wherein a pitch between the first patterns and between the second patterns is 100 nm or less.

5. The template according to claim 1, wherein the first polarized light is TM polarized light, and the second polarized light is TE polarized light.

6. The template according to claim 1, wherein the first region, the second region, and the third region each includes a film reflecting visible light.

7. A workpiece comprising:
an alignment mark including first marks arranged at a second pitch in a first direction, and second marks arranged at a first pitch in the first direction,
at least one of the first marks includes a first region and a third region,
at least one of the second marks includes a second region and the third region,
the first region has first patterns arranged in a line-and-space form in the first direction,
the second region has second patterns arranged in a line-and-space form in a second direction orthogonal to the first direction,
wherein
in the first region, first polarized light having electric fields vibrating along a first plane including the first direction is transmitted with a higher transmittance than second polarized light having electric fields vibrating along a second plane orthogonal to the first plane, and the second polarized light is reflected with a higher reflectance than the first polarized light, and
in the second region, the second polarized light is transmitted with a higher transmittance than the first polarized light, and the first polarized light is reflected with a higher reflectance than the second polarized light.

8. The workpiece according to claim 7, wherein the third region includes third patterns arranged in a solid or lattice form.

9. The workpiece according to claim 8, wherein the first pitch and the second pitch are 2000 nm or less.

10. The workpiece according to claim 9, wherein a pitch between the first patterns and between the second patterns is 100 nm or less.

11. The workpiece according to claim 7, wherein the first polarized light is TM polarized light, and the second polarized light is TE polarized light.

12. The workpiece according to claim 7, wherein the first region, the second region, and the third region include films reflecting visible light.

13. An alignment method comprising:
setting a template and a workpiece to face each other, the template having a first alignment mark formed thereon and the workpiece having a second alignment mark formed thereon;
irradiating the template with first polarized light having electric fields vibrating along a first plane;
acquiring first moire information regarding moire generated by the first polarized light; and
irradiating the template with second polarized light having electric fields vibrating along a second plane orthogonal to the first plane;
acquiring second moire information regarding moire generated by the second polarized light; and
adjusting relative positions of the template and the workpiece based on the first moire information and the second moire information,
wherein
the first alignment mark includes first marks arranged at a first pitch in a first direction, and second marks arranged at a second pitch in the first direction,
at least one of the first marks includes a first region and a third region,
at least one of the second marks includes a second region and the third region,
the first region has first patterns arranged in a line-and-space form in the first direction,
the second region has second patterns arranged in a line-and-space form in a second direction orthogonal to the first direction,
the second alignment mark includes third marks arranged at the second pitch in the first direction, and fourth marks arranged at the first pitch in the first direction,
at least one of the third marks includes the first region and the third region, and
at least one of the fourth marks includes the second region and the third region.

14. The alignment method according to claim 13, wherein the third region includes third patterns arranged in a solid or lattice form.

15. The alignment method according to claim 14, wherein the first pitch and the second pitch are 2000 nm or less.

16. The alignment method according to claim 14, wherein a pitch between the first patterns and between the second patterns is 100 nm or less.

17. The alignment method according to claim 13, wherein in the first region, the first polarized light is transmitted with a higher transmittance than the second polarized light, and the second polarized light is reflected with a higher reflectance than the first polarized light, and
in the second region, the second polarized light is transmitted with a higher transmittance than the first polarized light, and the first polarized light is reflected with a higher reflectance than the second polarized light.

18. The alignment method according to claim 17, wherein the first polarized light is TM polarized light, and the second polarized light is TE polarized light.

* * * * *